US008860404B2

(12) United States Patent
Dwyer et al.

(10) Patent No.: US 8,860,404 B2
(45) Date of Patent: Oct. 14, 2014

(54) MAGNETIC FIELD SENSORS AND RELATED TECHNIQUES THAT CAN PROVIDE A SELF-TEST USING SIGNALS AND RELATED THRESHOLDS

(75) Inventors: Daniel S. Dwyer, Auburn, NH (US); Christine Graham, Bow, NH (US); P. Karl Scheller, Bow, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 136 days.

(21) Appl. No.: 13/526,113

(22) Filed: Jun. 18, 2012

(65) Prior Publication Data

US 2013/0335068 A1 Dec. 19, 2013

(51) Int. Cl.
G01B 7/30 (2006.01)
(52) U.S. Cl.
USPC ............... 324/207.25; 324/207.2; 324/207.21
(58) Field of Classification Search
USPC ............. 324/207.2, 207.21, 207.25; 714/733, 714/740
See application file for complete search history.

(56) References Cited

U.S. PATENT DOCUMENTS

| 5,218,298 | A | 6/1993 | Vig |
| 5,781,005 | A | 7/1998 | Vig et al. |
| 6,242,908 | B1 * | 6/2001 | Scheller et al. ............ 324/207.2 |
| 6,278,269 | B1 | 8/2001 | Vig et al. |
| 6,525,531 | B2 | 2/2003 | Forrest et al. |
| 6,687,644 | B1 | 2/2004 | Zinke et al. |
| 7,362,094 | B2 | 4/2008 | Voisine et al. |
| 7,365,530 | B2 | 4/2008 | Bailey et al. |
| 7,800,389 | B2 | 9/2010 | Friedrich et al. |
| 7,923,996 | B2 | 4/2011 | Doogue et al. |
| 8,030,918 | B2 | 10/2011 | Doogue et al. |
| 2009/0024889 | A1 | 1/2009 | Forrest et al. |
| 2009/0251134 | A1 * | 10/2009 | Uenoyama ............... 324/207.21 |
| 2010/0026279 | A1 | 2/2010 | Vig et al. |
| 2010/0211347 | A1 | 8/2010 | Friedrich et al. |
| 2010/0231202 | A1 | 9/2010 | Scheller et al. |
| 2011/0018533 | A1 | 1/2011 | Cesaretti et al. |

FOREIGN PATENT DOCUMENTS

| EP | 0 944 888 B1 | 10/2001 |
| WO | WO 2008/145662 A1 | 12/2008 |

OTHER PUBLICATIONS

Allegro Microsystems, Inc. Data Sheet A1341; "High Precision, Highly Programmable Linear Hall Effect Sensor IC with EEPROM, Output Protocols SENT and PWM, and Advanced Output Linearization Capabilities;" May 17, 2010; 46 pages.
Allegro Microsystems, Inc. Data Sheet ATS601LSG; "Non-TPOS, Tooth Detecting Speed Sensor;" Nov. 1, 2011; 9 pages.

(Continued)

Primary Examiner — Jay Patidar
(74) Attorney, Agent, or Firm — Daly, Crowley, Mofford & Durkee, LLP

(57) ABSTRACT

Magnetic field sensor and related techniques can identify passing conditions, failing conditions, and marginal conditions of a sensed object. The magnetic field sensor and techniques can use one or more peak values of a proximity signal representative of proximity of the sensed object, can generate one or more difference values representative of difference between the peak values of the proximity signal and threshold values of a threshold signal proportional to the peak values, can categorize the one or more difference values into a plurality of potential categories, wherein at least one of the plurality of potential categories is representative of a respective passing self-test and wherein another at least one of the plurality of potential categories is representative of a respective marginally passing self-test, can assign category values to the plurality of potential categories, and can communicate at least one of the plurality of category values.

10 Claims, 24 Drawing Sheets

(56) References Cited

OTHER PUBLICATIONS

Cesaretti et al.; "Circuits and Methods for Self-Calibrating or Self-Testing a Magnetic Field Sensor;" U.S. Appl. No. 13/095,371, filed Apr. 27, 2011; 62 pages.

Cesaretti et al.; "Circuits and Methods Using Adjustable Feedback for Self-Calibrating or Self-Testing a Magnetic Field Sensor with an Adjustable Time Constraint;" U.S. Appl. No. 13/398,127, filed Feb. 16, 2012; 85 pages.

Donovan et al.; "Systems and Methods for Synchronizing Sensor Data;" U.S. Appl. No. 12/968,353, filed Dec. 15, 2010; 37 pages.

PCT Invitation to Pay Additional Fees and PCT Partial Search Report; dated Jul. 30, 2013; for PCT Pat. App. No. PCT/US2013/043309; 6 pages.

PCT Search Report and Written Opinion of the ISA dated Nov. 25, 2013; for PCT Pat. App. No. PCT/US2013/043309; 29 pages.

Office Action dated Aug. 18, 2014; for U.S. Appl. No. 13/526,103; 17 pages.

\* cited by examiner

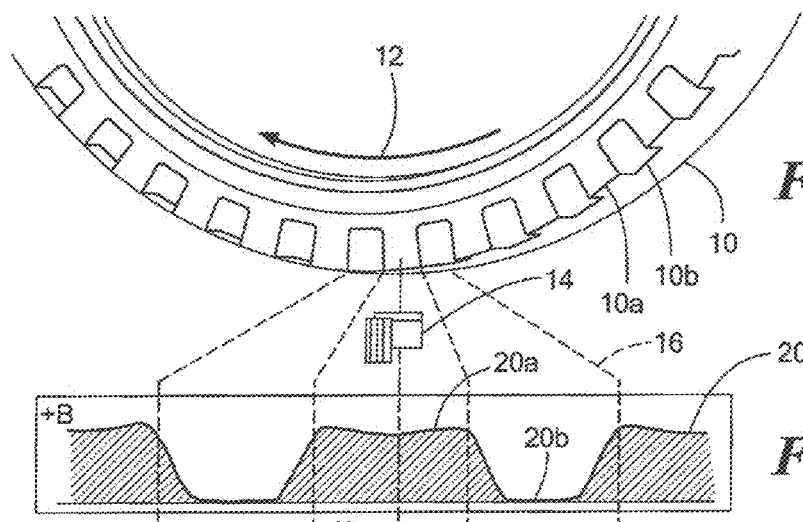
*FIG. 1*
*FIG. 1A*
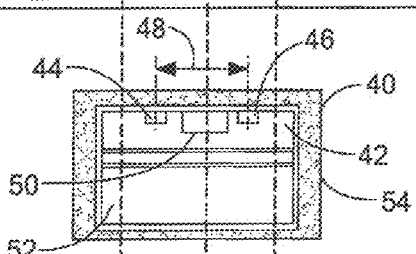
*FIG. 1B*
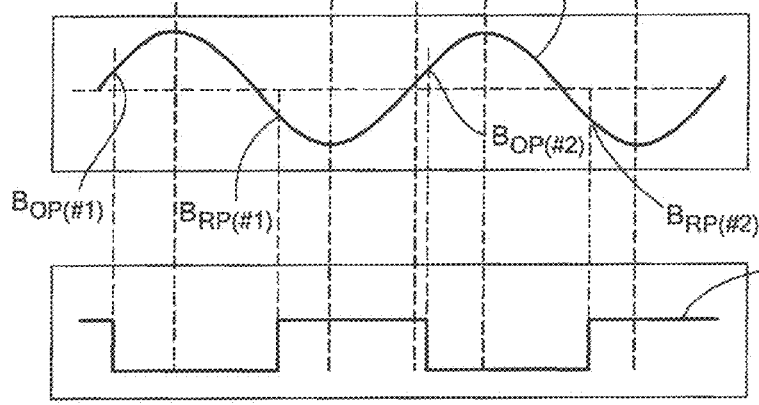
*FIG. 1C*
*FIG. 1D*

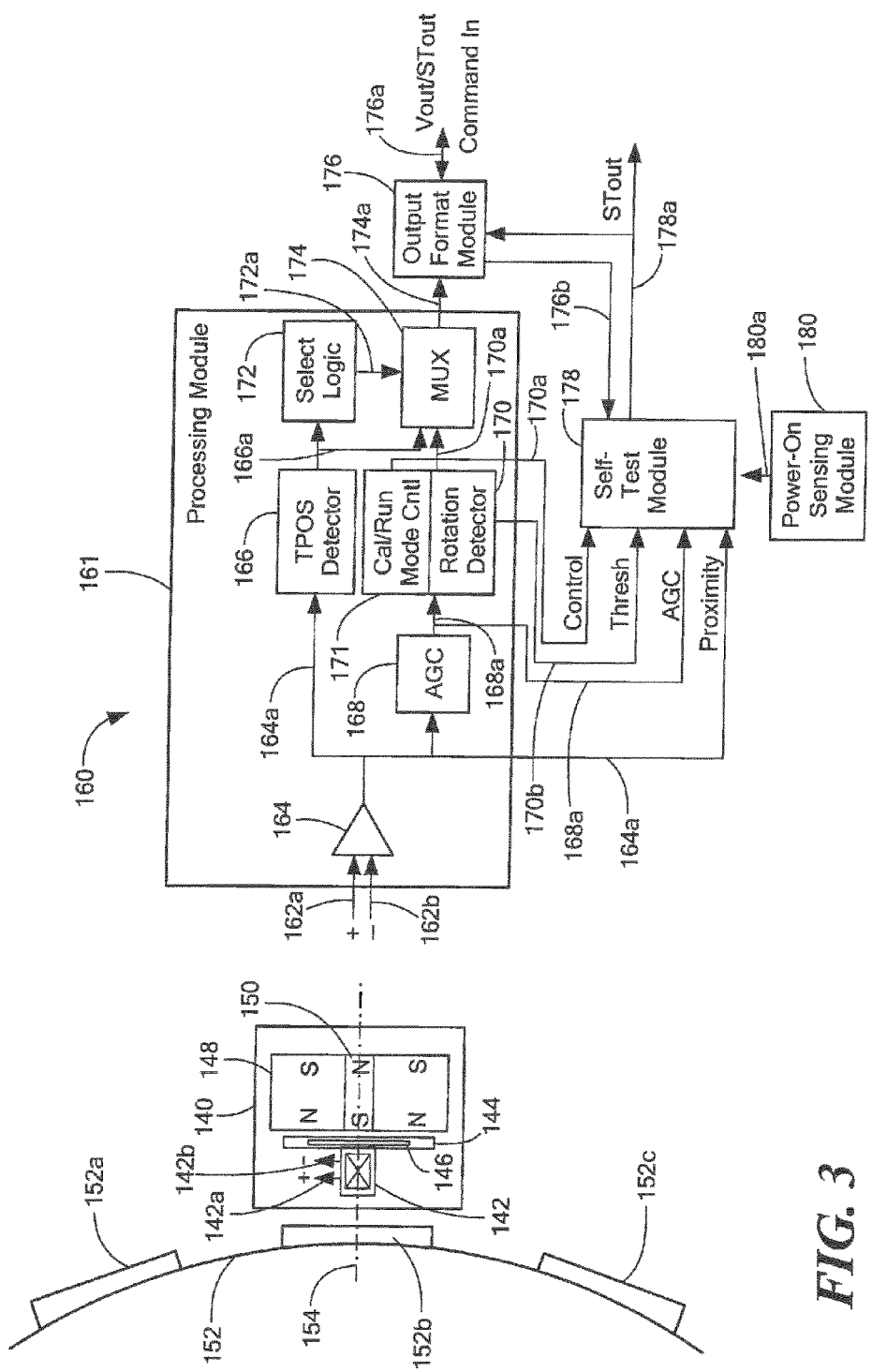

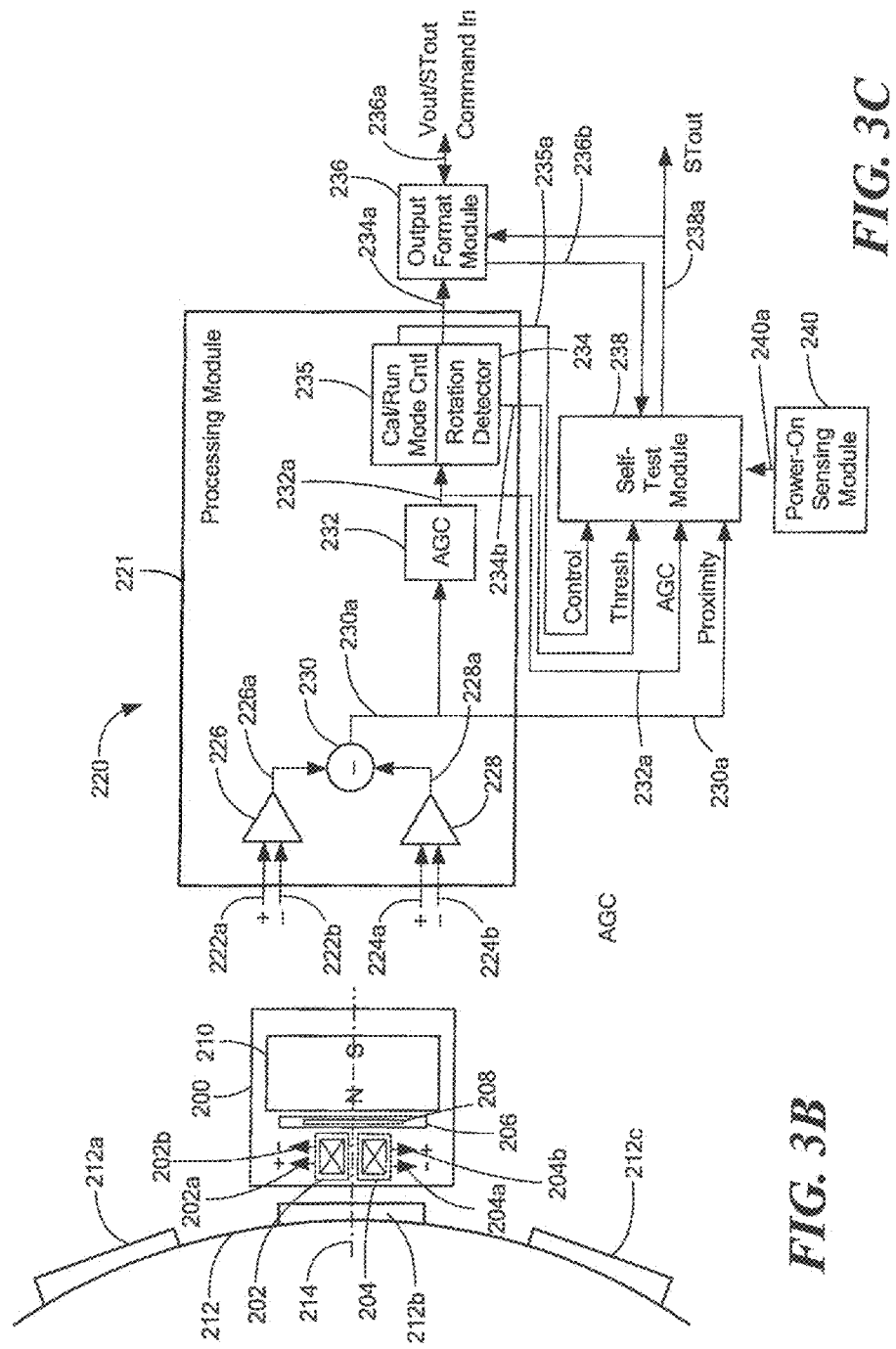

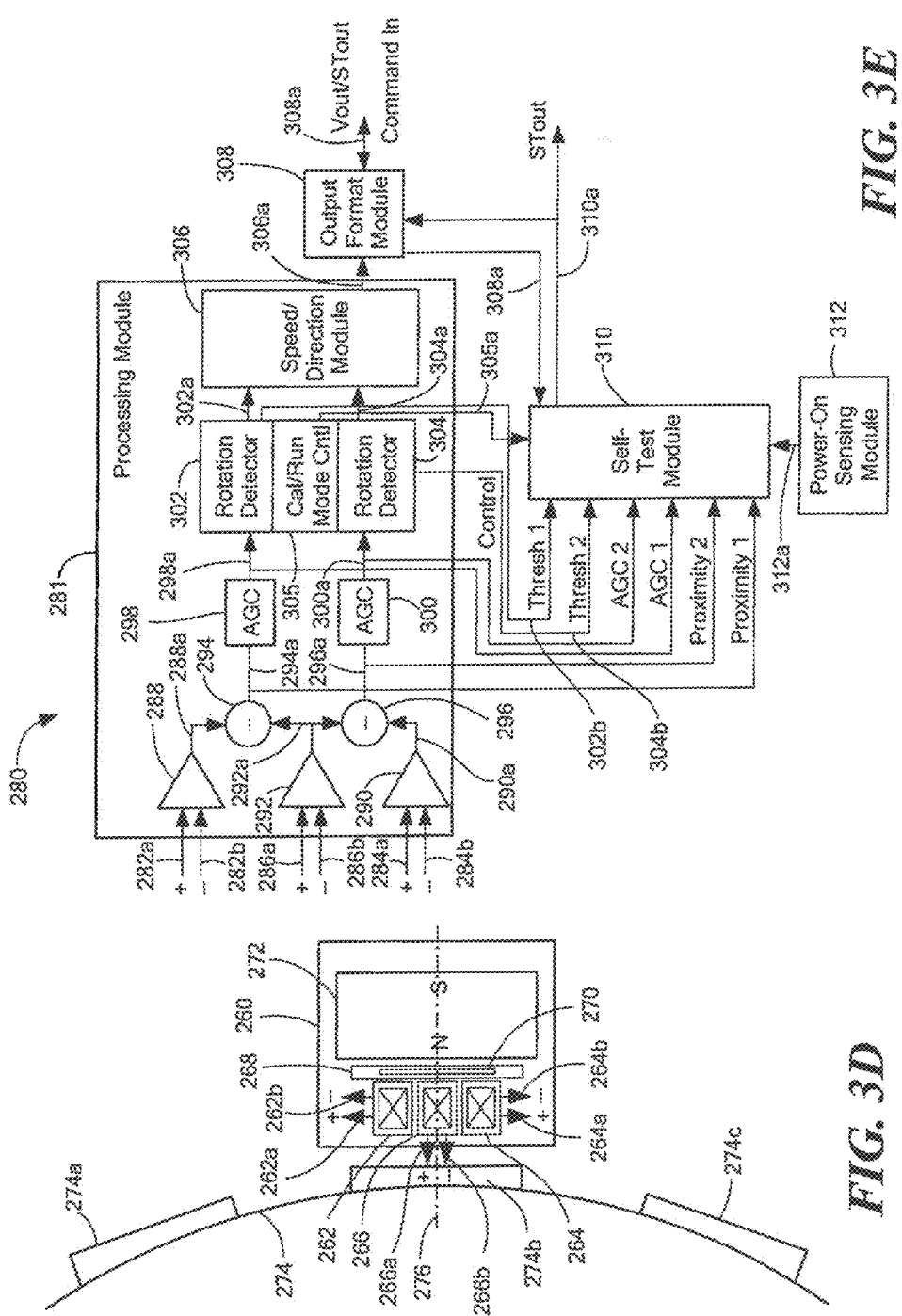

|  | | 3.000 | 2.848 | 2.681 | 2.132 | 1.641 |
| --- | --- | --- | --- | --- | --- | --- |
| | 1.245 | 1.152 | 1.152 | 1.178 | 1.438 | 1.716 |
| | 2.012 | 2.175 | 2.218 | 2.218 | 2.095 | 1.860 |
| Sampled | 1.565 | 1.281 | 1.078 | 1.000 | 1.000 | 1.098 |
| Analog | 1.357 | 1.722 | 2.105 | 2.402 | 2.558 | 2.558 |
| Voltage | 2.418 | 2.218 | 2.001 | 1.817 | 1.704 | 1.704 |
| | 1.841 | 2.108 | 2.432 | 2.728 | 2.938 | 2.987 |
| | 2.987 | 2.834 | 2.431 | 1.994 | 1.518 | 1.162 |
| | 1.000 | 1.000 | 1.087 | 1.395 | 1.852 | 2.331 |
| | 2.742 | 2.965 | ... | | | |

}390

|  |  | 1011 | 1010 | 1001 | 0110 | 0100 |
| --- | --- | --- | --- | --- | --- | --- |
| | 0010 | 0001 | 0001 | 0010 | 0100 | 0101 |
| | 0111 | 0111 | 1000 | 0111 | 0110 | 0101 |
| | 0011 | 0010 | 0001 | 0001 | 0001 | 0010 |
| DAC | 0011 | 0101 | 0111 | 1001 | 1001 | 1000 |
| State | 1000 | 0111 | 0110 | 0101 | 0100 | 0101 |
| | 0110 | 0111 | 1001 | 1010 | 1011 | 1011 |
| | 1011 | 1010 | 1000 | 0110 | 0011 | 0001 |
| | 0001 | 0001 | 0010 | 0100 | 0110 | 1000 |
| | 1010 | 1011 | ... | | | |

}400

| DAC | ... | 1011 | 0001 | 1000 | 0001 | 1001 |
| --- | --- | --- | --- | --- | --- | --- |
| Peaks | 0100 | 1011 | 0001 | 1011 | ... | |

}410

MAGNETIC FIELD SENSORS AND RELATED TECHNIQUES THAT CAN PROVIDE A SELF-TEST USING SIGNALS AND RELATED THRESHOLDS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to a magnetic field sensor that has self-test capability and that can provide information about geometrical consistency of an object sensed by the magnetic field sensor.

BACKGROUND OF THE INVENTION

Various types of magnetic field sensing elements are known, including Hall Effect elements and magnetoresistance elements. Magnetic field sensors generally include a magnetic field sensing element and other electronic components. Some magnetic field sensors also include a fixed permanent magnet.

Magnetic field sensors provide an electrical signal representative of a sensed magnetic field. In some embodiments, the magnetic field sensor provides information about a sensed ferromagnetic object by sensing fluctuations of the magnetic field associated with the magnet part of the magnetic field sensor as an object moves within a magnetic field generated by the magnet. In the presence of a moving ferromagnetic object, the magnetic field signal sensed by the magnetic field sensor varies in accordance with a shape or profile of the moving ferromagnetic object.

In other embodiments, the magnetic field sensor has no magnet, and the magnetic field sensor provides information about a sensed object to which a magnet is coupled.

Magnetic field sensors are often used to detect movement of features of a ferromagnetic gear, such as gear teeth and/or gear slots. A magnetic field sensor in this application is commonly referred to as a "gear tooth" sensor.

In some arrangements, the gear is placed upon a target object, for example, a camshaft in an engine, thus, it is the rotation of the target object (e.g., camshaft) that is sensed by detection of the moving features of the gear. Gear tooth sensors are used, for example, in automotive applications to provide information to an engine control processor for ignition timing control, fuel management, and other operations.

In other embodiments, a ring magnet with a plurality of alternating poles, which can be ferromagnetic or otherwise magnetic, is coupled to the target object. In these embodiments, the magnetic field sensor senses rotation of the ring magnet and the target object to which it is coupled.

Information provided by the gear tooth sensor to the engine control processor can include, but is not limited to, an absolute angle of rotation of a target object (e.g., a camshaft) as it rotates, a speed of rotation, and, in some embodiments, a direction of rotation. With this information, the engine control processor can adjust the timing of firing of the ignition system and the timing of fuel injection by the fuel injection system.

Gear tooth sensors can include internal "detectors" that fall into two categories, namely, true power on state (TPOS) detectors, and precision rotation detectors. The two categories are generally distinguished by two characteristics: the speed with which they can identify edges of a gear after they are powered up, and the ultimate accuracy of their ability to detect the edges of the gear and place edges of an output signal at the proper times. TPOS sensors tend to be fast but have lower accuracy, while precision rotation detectors tend to be slower to detect a tooth or valley, but have higher accuracy.

Precision rotation detectors tend not to provide an accurate output signal (e.g., indication of tooth or valley) immediately upon movement of the target object from zero rotating speed, but instead provide an accurate output signal only once the target object has moved through at least one tooth/valley (pitch) of the target. For example, in one type of magnetic field sensor described in U.S. Pat. No. 6,525,531, issued Feb. 25, 2003, a positive digital-to-analog converter (PDAC) and a negative digital-to-analog converter (NDAC) track positive and negative peaks of magnetic field signal, respectively, for use in generating a threshold signal. A varying magnetic field signal is compared to the threshold signal. However, the outputs of the PDAC and the NDAC may not be accurate indications of the positive and negative peaks of the magnetic field signal until several cycles of the signal (i.e., signal peaks) occur (i.e., until several gear teeth have passed).

In contrast, a true power on state (TPOS) detector can provide a moderately accurate output signal state (e.g., indication of tooth or valley) before movement of a target object (e.g., camshaft) from zero rotating speed. Furthermore, even when the target object is not moving, the TPOS detector can provide an indication of whether the TPOS detector is in front of a gear tooth or a valley. The TPOS detector can be used in conjunction with a precision rotation detector in a common integrated circuit assembly, both providing information to the engine control processor at different times.

As described above, the conventional TPOS detector provides an accurate output signal before rotation of the target object and before the precision rotation detector can provide an accurate output signal. The TPOS detector can provide information to the engine control processor that can be more accurate than information provided by the precision rotation detector for time periods at the beginning of rotation of the target object, but which may be less accurate when the object is rotating at speed.

For embodiments that include both a TPOS detector and a precision rotation detector in a common integrated circuit assembly, when the object is rotating at speed, the engine control processor can primarily use rotation information provided by the precision rotation detector. In most conventional applications, once the magnetic field sensor switches to use the precision rotation detector, it does not return to use the TPOS detector until the target object stops rotating or nearly stops rotating.

A conventional TPOS detector is described in U.S. Pat. No. 7,362,094, issued Apr. 22, 2008. The conventional TPOS detector includes a comparator for comparing the magnetic field signal to a fixed, often trimmed, threshold signal. The conventional TPOS detector can be used in conjunction with and can detect rotational information about a TPOS cam (like a gear), which is disposed upon a target object, e.g., an engine camshaft, configured to rotate.

An output signal from a conventional TPOS detector has at least two states, and typically a high and a low state. The state of the conventional TPOS output signal is high when over one feature (e.g. tooth) and low when over the another feature (e.g. valley) as the target object rotates, in accordance with features on the TPOS cam attached to the target object. Similarly, the output signal from a conventional precision rotation detector has at least two states, and typically a high and a low state.

Gear tooth sensors depend upon a variety of mechanical characteristics in order to provide accuracy. For example, the gear tooth sensor must be placed close to (i.e., at a small air gap relative to) the ferromagnetic gear, teeth and valleys of which it senses as they pass. A larger air gap results in a smaller signal processed by the gear tooth sensors, which can result in noise or jitter in positions of edges of the two-state output signal generated by the gear tooth sensor. In radial sensing configurations, radial asymmetry of the ferromagnetic gear sensed by the gear tooth sensor can result in an air gap that varies as the ferromagnetic gear rotates. The radial asymmetry can take a variety of forms. For example, the radial asymmetry can result from an axis of rotation not centered in the ferromagnetic gear or from bent or missing gear teeth. In addition, wobble of the ferromagnetic gear can result in an air gap that varies. Wobble is described more fully below in conjunction with FIG. 2.

Radial asymmetry and wobble can be the result of circumstances that happen during production of an assembly, for example an engine. Dropping an assembly during production can bend a gear sensed by the gear tooth sensor.

A gear tooth sensor can generate what appears to be a proper output signal even when exposed to a gear with radial asymmetry or with wobble. However, the gear tooth sensor can be in a marginal condition subject to failure if any further variation in the air gap occurs, for example, due to temperature changes.

Thus, it would be desirable to provide an arrangement that can sense not only a pass/fail condition, but also a marginal condition in an assembly that contains a gear tooth sensor and a sensed object (e.g. a ferromagnetic gear).

SUMMARY OF THE INVENTION

The present invention provides an arrangement that can sense not only a pass/fail condition, but also a marginal condition in an assembly that contains a gear tooth sensor and a sensed object (e.g. a ferromagnetic gear).

In accordance with one aspect of the present invention, a method of performing a self-test associated with a magnetic field sensor includes generating a magnetic-field-responsive signal responsive to a proximity of a sensed object with one or more magnetic field sensing elements, The method also includes generating a threshold signal proportional to peak values of the magnetic-field-responsive signal. The method also includes identifying a plurality of peak values of the magnetic-field-responsive signal. The method also includes identifying a plurality of threshold values of the threshold signal. The method also includes generating one or more difference values by differencing the identified peak values and associated identified threshold values. The method also includes categorizing the one or more difference values into a plurality of potential categories, wherein the plurality of potential categories is representative of a plurality of self-test states of the proximity signal. The method also includes communicating at least one of the plurality of potential categories into which at least one of the one or more characteristic values was categorized.

In accordance with another aspect of the present invention, a magnetic field sensor includes a substrate and one or more magnetic field sensing elements disposed on the substrate and configured to generate a proximity signal responsive to a proximity of a sensed object. The magnetic field sensor also includes an amplifier circuit disposed on the substrate and configured to generate a magnetic-field-responsive signal representative of the proximity signal. The magnetic field sensor also includes a processing module disposed on the substrate and configured to generate a threshold signal proportional to peak values of the magnetic-field-responsive signal. The magnetic field sensor also includes a self-test module disposed on the substrate. The self-test module is configured to identify a plurality of peak values of the magnetic-field-responsive signal, configured to identifying a plurality of threshold values of the threshold signal, configured to generate one or more difference values by differencing the identified peak values and associated identified threshold values, and configured to categorize the one or more difference values into a plurality of potential categories. The plurality of potential categories is representative of a plurality of self-test states of the proximity signal. The magnetic field sensor also includes an output format module disposed on the substrate and configured to communicate at least one of the plurality of potential categories into which at least one of the one or more characteristic values was categorized.

BRIEF DESCRIPTION OF THE DRAWINGS

The foregoing features of the invention, as well as the invention itself may be more fully understood from the following detailed description of the drawings, in which:

FIG. 1 is a pictorial showing a rotating gear having gear teeth;

FIG. 1A is a graph showing a magnetic field versus time as the gear teeth of the gear of FIG. 1 pass by a point;

FIG. 1B is a pictorial of magnetic field sensor proximate to the gear of FIG. 1 and operable to sense the gear teeth as they pass by the magnetic field sensor;

FIG. 1C is a graph of a so-called "proximity signal" generated by the magnetic field sensor of FIG. 1B as the gear teeth of the gear of FIG. 1 pass by the magnetic field sensor;

FIG. 1D is a graph of an output signal generated by the magnetic field sensor of FIG. 1B as the gear of FIG. 1 rotates;

FIGS. 3-3E are block diagrams showing a variety of magnetic field sensor configurations and variety of electronic circuits used within the magnetic field sensors, each electronic circuit having a self-test module;

DETAILED DESCRIPTION OF THE INVENTION

Figure 2:
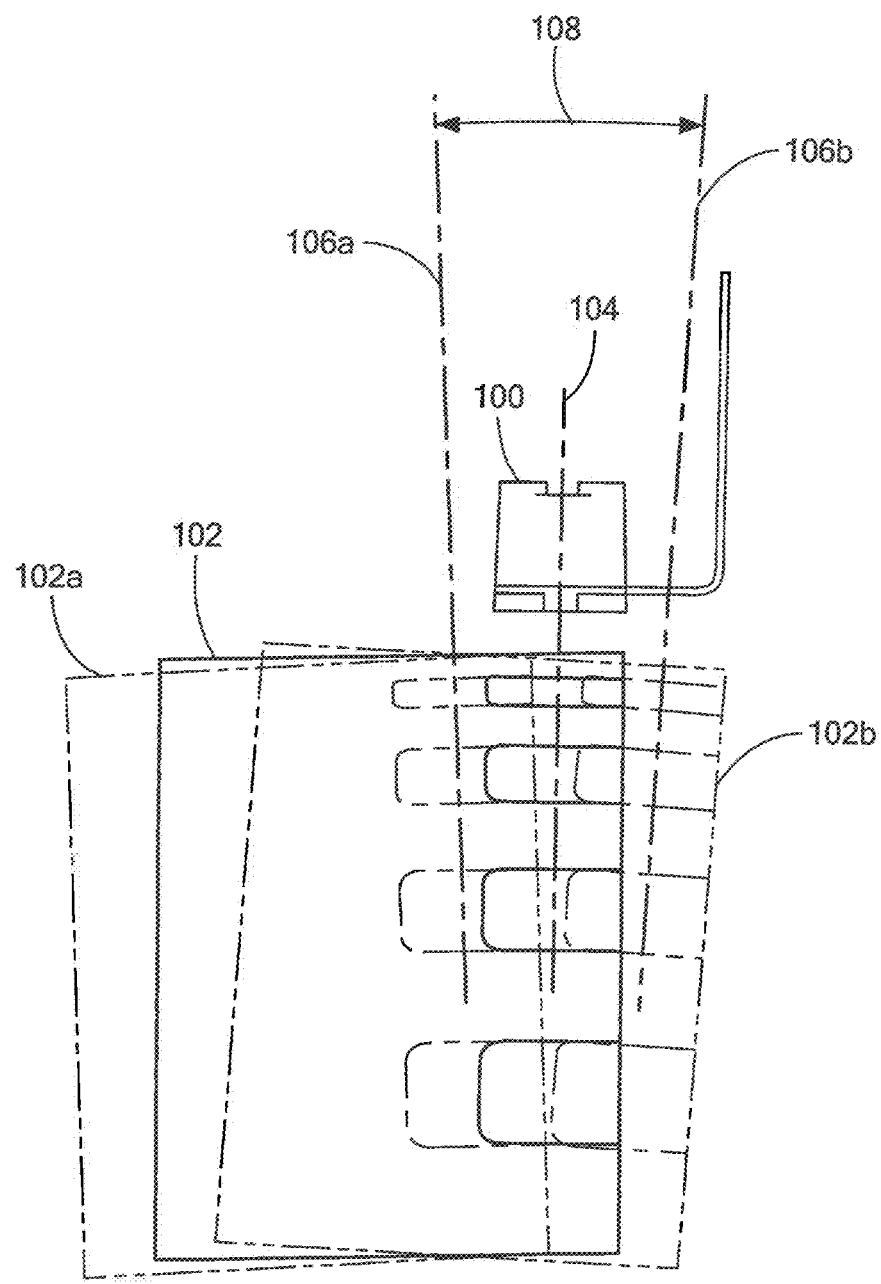
FIG. 2 is a pictorial showing a gear having wobble.

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more elements arranged in various configurations, e.g., a half bridge or full (Wheatstone) bridge. Depending on the device type and other application requirements, the sensing element XX may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

A so-called "circular vertical Hall" (CVH) sensing element, which includes a plurality of vertical magnetic field sensing elements, is known and described in PCT Patent Application No. PCT/EP2008/056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element includes a circular arrangement of vertical Hall elements arranged over a common circular implant region in a substrate. The CVH sensing element can be used to sense a direction (and optionally a strength) of a magnetic field in a plane of the substrate.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements and semiconductor magnetoresistance elements tend to have axes of sensitivity perpendicular to a substrate, while AMR, GMR, and TMR types of magnetoresistance elements and vertical Hall elements (including circular vertical Hall (CVH) sensing elements) tend to have axes of sensitivity parallel to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch that senses the proximity of a ferromagnetic object, a rotation detector (true power on state (TPOS) detector and precision rotation detector) that senses passing ferromagnetic articles, for example, magnetic domains of a ring magnet, and a magnetic field sensor that senses a magnetic field density of a magnetic field.

As used herein, the term "accuracy," when referring to a magnetic field sensor, is used to refer to a variety of aspects of the magnetic field sensor. These aspects include, but are not limited to, an ability of the magnetic field sensor to differentiate: a gear tooth from a gear valley (or, more generally, the presence of a ferromagnetic object from the absence of a ferromagnetic object) when the gear is not rotating and/or when the gear is rotating (or, more generally, when a ferromagnetic object is moving or not moving), an ability to identify an edge of a tooth of the gear from the tooth or the valley of the gear (or, more generally, the edge of a ferromagnetic object), and a rotational accuracy with which the edge of the gear tooth is identified (or, more generally, the positional accuracy with which an edge of a ferromagnetic object can be identified), i.e., output signal edge placement accuracy and consistency with respect to gear tooth edges passing by the magnetic field sensor.

It is desirable for magnetic field sensors to achieve accuracy even in the presence of variations in an air gap between the magnetic field sensor and the gear that may change from installation to installation or from time to time. It is also desirable for magnetic field sensors to achieve accuracy even in the presence of variations in relative positions of the magnet and the magnetic field sensing element within the magnetic field sensor. It is also desirable for magnetic field sensors to achieve accuracy even in the presence of unit-to-unit variations in the magnetic field generated by a magnet within the magnetic field sensors. It is also desirable for magnetic field sensors to achieve accuracy even in the presence of variations of an axial rotation of the magnetic field sensors relative to the gear. It is also desirable for magnetic field sensors to achieve accuracy even in the presence of temperature variations of the magnetic field sensors. It is also desirable for magnetic field sensors to achieve accuracy even in the presence of wobble and/or radial asymmetry of a gear sensed by the magnetic field sensors.

Examples below describe a particular gear as may be used upon an engine camshaft target object. However, similar circuits and techniques can be used with other cams or gears disposed upon the engine camshaft, or upon other rotating parts of a vehicle (e.g., crank shaft, transmission gear, antilock braking system (ABS)), or upon rotating parts of a device that is not an automotive grade vehicle (e.g. tractors, golf carts, etc). The gear is not a part of the magnetic field sensor described below. The gear can have ferromagnetic gear teeth.

Examples shown below show a so-called "back-biased" arrangement, in which a permanent magnet, disposed within an integrated circuit package (or alternatively, outside of the magnetic field sensor package), provides a magnet field, which is modulated by passing ferromagnetic gear teeth.

In other embodiments, there is can be no back biasing magnet, and instead, the magnetic field sensor can sense a changing magnetic field generated by a moving permanent magnet, for example, a ring magnet having alternating north and south poles, i.e., magnetic features.

Also, while examples are shown below of magnetic field sensors that can sense ferromagnetic gear teeth upon a gear configured to rotate, the magnetic field sensors can be used in other applications. The other applications include, but are not limited to, sensing ferromagnetic objects, for example, soft ferromagnetic objects (with a back-biased arrangement) or hard ferromagnetic objects (i.e., permanent magnets) or magnetic objects upon a linear structure configured to move linearly.

As used herein, the term "characteristic value" is used to describe a characteristic of an electrical signal, either a continuous analog signal, a sampled analog signal, or a digital signal. Examples are given below of characteristic values, including, peak-to-peak values, peak values (i.e., zero-to-peak values), DC values (e.g., mean values), and deviation values (e.g., standard deviation values). However, it should be understood that other characteristic values can be used.

As used herein, the term "self-test" is used with reference to a magnetic field sensor configured to sense a movement of an object. The term "self-test" is used to describe functions of the magnetic field sensor that can sense, i.e., test, not only proper or improper operation of the magnetic field sensor itself, but also proper or improper magnetic fields sensed by the magnetic field sensor as may relate to proper or improper characteristics of the sensed object. For example, where the sensed object is a gear, the self-test can identify proper or improper aspects (e.g., rotation) of the gear, as may be indicative, for example, of a wobble of the gear, a bent gear tooth, or a radial asymmetry of the gear.

As used herein, it should be understood that the term "ferromagnetic object" includes objects comprised of at least one of a soft magnetic material or a hard magnetic material. The term "soft magnetic material" is used herein to refer to a material (e.g., non-magnetized iron or ferrite) that is influenced by a magnetic field but that tends not to generate a magnetic field. In contrast, the term "hard magnetic material" is used herein to refer to a material that generates a magnetic field (i.e., a magnet). With regard to materials that generate a magnetic field, it will be understood that some non-ferrous materials (e.g., rare earth materials) can generate a magnetic field. It is intended that the term "ferromagnetic" encompass those materials as well.

While signals having particular states (e.g., high, low, mid) are shown in examples below, it should be understood that the states can be different states. For examples, a high state can be interchanged with a low state, and a mid state can be interchanged with a high or a low state.

Relative and absolute sizes and scales represented in figures below are sizes and scales selected for clarity and do not necessarily represent true sizes and scales.

Referring now to FIG. 1, a ferromagnetic gear 10 can be sensed by a magnetic field sensor 14. More particularly, gear teeth, e.g., 10a, and valleys, e.g., 10b, can be sensed by the magnetic field sensor 14 as the gear 10 rotates, for example, in a direction 12.

In some other embodiments, the gear is instead a magnetic object, for example, a ring magnet having a plurality of magnetic regions with opposing magnetic field directions.

Referring now to FIG. 1A, a magnetic flux density curve 20 has peaks, e.g., 20a, and valleys, e.g., 20b, associated with gear teeth and valleys upon the gear 10 of FIG. 1 when the ferromagnetic gear 10 of FIG. 1 is exposed to a static DC magnetic field.

Referring now to FIG. 1B, a magnetic field sensor 40 can be the same as or similar to the magnetic field sensor 14 of FIG. 1 and can experience the changing magnetic field 20 of FIG. 1A as the gear 10 of FIG. 1 rotates.

The magnetic field sensor 40 can include a substrate 42 upon which, for example, two magnetic field sensing elements 44, 46 can be disposed, which can be separated by a distance 48 in a direction perpendicular to a radius of the gear 10 of FIG. 1. And electronic circuit 50 coupled to the two magnetic field sensing elements 44, 46 can also be disposed upon the substrate. A permanent magnet 52 can be disposed proximate to the substrate 42 and can generate a magnetic field that is modulated by the teeth and valleys of the gear 10 of FIG. 1 as the gear 10 rotates.

The magnetic field sensor 40 can include an encapsulation 54 surrounding the substrate 42 and the magnet 52.

The magnetic field sensing elements 44, 46 and the electronic circuit 50 are described in more detail below in conjunction with FIGS. 3-3E. Let it suffice here to say that the two magnetic field sensing elements 44, 46 generate analog proximity signals that vary in relation to the magnetic field 20 of FIG. 1A as the gear 10 of FIG. 1 rotates. In some embodiments, two proximity signals generated by the two magnetic sensing elements 44, 46 are combined (e.g., subtracted) so as to form one proximity signal. The proximity signals, or the one proximity signal, are received and processed by the electronic circuit 50 to generate a two state output signal.

Referring now to FIG. 1C, a signal 60 is representative of the proximity signal resulting from combining two proximity signals generated by the two magnetic field sensing elements 44, 46 of FIG. 1B. Operating point thresholds, BOP(#1) and BOP(#2), are shown. Release point thresholds, BRP(#1) and BRP(#2), are also shown. The electronic circuit 50 of FIG. 1B can be operable to generate the operating point and release point thresholds in a variety of ways described more fully below in conjunction with FIG. 13. In some embodiments, new operating and release point threshold are generated upon each cycle of the proximity signal 60. The proximity signal 60 can be compared with the operating point and release point thresholds.

Referring now to FIG. 1D, a signal 80 is representative of an output signal generated by the magnetic field sensor 40 of FIG. 1B as the gear 10 of FIG. 1 rotates. Edges of the signal 80 occur as the proximity signal 60 of FIG. 1C crosses operating point and release point thresholds a shown.

It should be understood that a frequency of the signal 80 is representative of a rotational speed of the gear 10 or FIG. 1. It should also be understood that positions of edges of the signal 80 are representative of positions of edges of the gear teeth of the gear 10 of FIG. 1. It is desirable that the edges of the signal 80 accurately represent positions of the gear teeth of the gear 10 of FIG. 1, without noise and without jitter.

Referring now to FIG. 2, a magnetic field sensor 100 is disposed proximate to a gear 102 configured to rotate. The magnetic field sensor 100 can be the same as or similar to the magnetic field sensor 40 of FIG. 1B.

As described above, the gear 102 can experience wobble, resulting in the gear 102 or parts of the gear 102, being at a position 102a at some parts of rotation of the gear 102 and at a position 102b at other parts of the rotation of the gear 102. The wobble can be characterized by a radial axis 104 of the gear 102 changing between positions 106a and 106b over a range of positions 108 as the gear 102 rotates.

It should be understood that, in the presence of the gear 102 that wobbles, an air gap between the magnetic field sensor 100 and the gear 102 changes as the gear 102 rotates. The changing air gap results in a changing magnitude of an analog proximity signal generated by magnetic field sensing elements within the magnetic field sensor 100 and a resulting loss of accuracy of the magnetic field sensor.

The wobble may be large enough so that an output signal (two-state signal) generated by the magnetic field sensor has gross irregularities in edge placements. However, the wobble may also be of a smaller magnitude resulting in no (or a small) effect upon the output signal. Still, if the air gap were to change further, for example, due to temperature, the output signal generated by the magnetic field sensor may degrade further. Thus, this condition may be deemed to be a marginal condition.

Figure 2A:
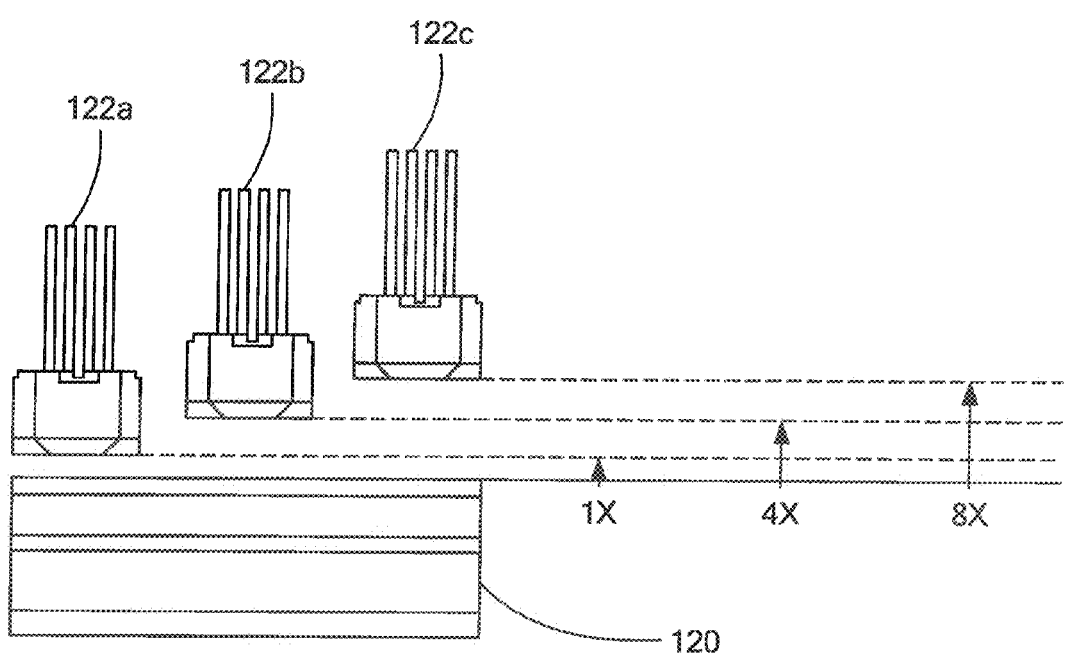
FIG. 2A is a pictorial of a magnetic field sensor proximate to a gear, the gear having radial asymmetry resulting in variation of an air gap between the gear and the magnetic field sensor.

Referring now to FIG. 2A, a magnetic field sensor 122, here shown with three different air gaps 122a, 122b, 122c relative to a gear 120 (i.e., at air gaps of 1×, 4×, and 8×), has a corresponding three different magnitudes (1×, 0.25×, and 0.15×) of analog proximity signals generated by magnetic field sensing elements (not shown) within the magnetic field sensor 122a, 122b, 122c as the gear 120 rotates. The relationship tends to be non-linear.

The three different air gaps can be representative of a continuous change in air gap as the gear 120 rotates, due to radial asymmetry of the gear 120, for example, resulting from an axis of rotation not geometrically centered on the gear.

Both the wobble of FIG. 2 and the radial asymmetry represented by FIG. 2A can result from damage of the gear during production. The wobble and radial asymmetry can also result from wear of the gear and axis upon which the gear rotates during operation of the assembly in which the gear is used.

Referring to FIG. 3, an exemplary magnetic field sensor 140 is responsive to a gear 152 having ferromagnetic gear teeth, e.g., gear teeth 152a, 152b, 152c. The magnetic field sensor 140 includes a magnetic field sensing element 142 coupled to an electronic circuit 146. The magnetic field sensing element 142 and the electronic circuit 146 can be disposed upon (i.e., integrated within or upon) a substrate 144. Here, the magnetic field sensing element 142 is shown to be a Hall element with an exaggerated size for clarity. As is known, a Hall element can be integrated within the substrate 144.

The magnetic field sensor 140 can also include a magnet 148. The magnet 148 is configured to generate a magnetic field, which is generally directed along an axis 154 at the position of the magnetic field sensing element 142, and which is subject to direction and amplitude changes depending upon positions of the gear teeth 152a, 152b, 152c relative to the magnetic field sensor 140.

The electronic circuit 148 is configured to generate an output signal (not shown), which can be the same as or similar to the signal 80 of FIG. 1D. The output signal, when the gear is not moving, has a state indicative of whether the magnetic field sensor 140 is over a gear tooth or a gear valley. The output signal, when the gear is rotating, has an edge rate or a frequency indicative of a speed of rotation of the gear. Edges or transitions of states of the output signal can be used to identify positions of edges of the gear teeth as they pass by the magnetic field sensor.

The magnet 148 can include a central core 150 disposed within the magnet 148. An exemplary magnet with a core is described in U.S. Pat. No. 6,278,269, entitled "Magnet Structure," issued Aug. 21, 2001, which patent is assigned to the assignee of the present invention and incorporated herein by reference in its entirety. As described in U.S. Pat. No. 6,278,269, the pole configuration provided by the magnet 148 with the core 150 lowers the base field (or baseline) of a flux density map of the magnetic field by bringing both poles of the magnetic field to a surface of the magnet proximate to the substrate 144. A predetermined baseline (e.g., within a range of about +/−six hundred Gauss) at the magnetic field sensing element 142, and a resulting differential magnetic field signal 142a, 142b (i.e., an analog differential proximity signal) near zero, can be achieved with proper design.

In contrast, when a gear tooth is proximate to the magnetic field sensing element 142, the magnetic field sensing element 142 experiences a higher magnetic field and generates the differential proximity signal 142a, 142b with a high value.

As is apparent, the baseline remains constant and close to zero even as the air gap between the gear teeth and the magnetic field sensor 140 varies. This advantageous result of low baseline substantially independent of air gap is achieved by presenting opposite poles at the face of the magnet 148 and core 150 proximate to the magnetic field sensing element. This effect is also described in U.S. Pat. No. 5,781,005, issued Jul. 14, 1998, entitled "Hall-Effect Ferromagnetic-Article-Proximity Sensor," which patent is assigned to the assignee of the present invention and incorporated herein by reference in its entirety.

The above-described low baseline results in an enhanced ability of the electronic circuit 146 to differentiate the presence of the gear tooth from a gear valley. Thus, the magnetic field sensor 140 can be referred to as a "tooth detector," as opposed to "edge detectors" described below.

The magnetic field described above and provided by the magnet 148 with the core 150 results in an improved accuracy of the magnetic field sensor 140. For example, the improved magnetic field allows the magnetic field sensing element 142 to be somewhat statically misaligned from a center of the magnet 148, as will occur due to unit-to-unit variations of mechanical alignments, without sacrificing accuracy of the magnetic field sensor 140. Accuracy is discussed above.

However, the analog differential proximity signal 142a, 142b generated by the magnetic field sensing element 140 still tend to vary in the presence of wobble or radial asymmetry of the gear 152. The wobble or radial asymmetry of the gear 152 can result in a complete inability (i.e., complete failure) of the magnetic field sensor 140 to accurately sense positions of the gear teeth. It will be understood that a complete failure may be more easily detected than a marginally functioning magnetic field sensor. Detections of marginal conditions are described more fully below.

Referring now to FIG. 3A, an exemplary electronic circuit 160 can be the same as or similar to electronic circuit 146 of FIG. 3. The electronic circuit 160 can include an amplifier 164 coupled to receive a differential proximity signal 162a, 162b, which can be the same as or similar to the differential proximity signal 142a, 142b generated by the magnetic field sensing element 142 of FIG. 3. The amplifier 164 is configured to generate an amplified signal 164a (also a proximity signal), which, in some embodiments, can split into two channels.

In a true power on state (TPOS) channel, a TPOS detector 166 can be coupled to receive the amplified signal 164a and configured to generate a TPOS output signal 166a. To this end, in some embodiments, the TPOS detector 166 can include a comparator (not shown) configured to compare the amplified signal 166a with a fixed predetermined (and trimmed) threshold. In these embodiments, the TPOS output signal 166a can be a two-state binary signal for which a high state is indicative of a gear tooth being proximate to the magnetic field sensor 140 of FIG. 3 and a low state is indicative of a gear valley being proximate to the magnetic field sensor 140, or vice versa.

In a precision rotation detector channel, an automatic gain control (AGC) 168 can be coupled to receive the amplified proximity signal 164a and configured to generate a gain controlled signal 168a. A precision rotation detector 170 can be coupled to receive the gain controlled signal 168a and configured to generate a precision rotation detector output signal 170a. Like the TPOS output signal 166a, the precision rotation detector output signal 170a can be a two-state binary signal for which a high state is indicative of a gear tooth being proximate to the magnetic field sensor 140 of FIG. 3 and a low state is indicative of a gear valley being proximate to the magnetic field sensor 140, or vice versa. Thus, both the TPOS detector 166 and the precision rotation detector 170 can be "tooth detectors."

In some alternate embodiments, the precision rotation detector 170 can be an "edge detector," which is unable to identify whether the magnetic field sensor 142 is proximate to a gear tooth or a gear valley, particularly when the gear is not moving. However, a low to high state transition of the precision rotation detector output signal 170a can be indicative of a transition from a gear valley being proximate to the magnetic field sensing element 142 to a gear tooth being proximate to the magnetic field sensing element 142, and a high to low state transition can be indicative of a transition from the gear tooth being proximate to the magnetic field sensing element 142 to a gear valley thing proximate to the magnetic field sensing element 142, or vice versa.

The precision rotation detector 170 can be coupled to, or can otherwise include, a calibration/running mode control module 171. The calibration/running mode control module 171 can be operable to cause the precision rotation detector 170 to use first thresholds for comparison with the gain controlled signal 168a during a "calibration mode," usually for a short time period following a beginning of rotation of the gear that is being sensed. Thereafter, the calibration/running mode control module 171 can be operable to cause the precision rotation detector 170 to use second different thresholds accurately determined by the precision rotation detector 170 during a "running mode."

Precision rotation detectors, e.g., the precision rotation detector 170, can have a variety of configurations. Some configurations are described in the above mentioned U.S. Pat. No. 6,525,531. However, other forms of precision rotation detectors are also known. An exemplary precision rotation detector and an exemplary TPOS detector are described in greater detail below in conjunction with FIG. 13.

In general, from discussion above, it will be appreciated that the TPOS output signal 166a is able to identify whether the magnetic field sensing element 142 is proximate to a gear tooth or to a gear valley, even when the gear, e.g., the gear 152 of FIG. 3 is stationary. However, since the TPOS detector 166 uses a fixed threshold, variations in the edge placement in the TPOS output signal 166a will occur due to a variety of factors, including, but not limited to, temperature variations, and variations in the air gap between the magnetic field sensing element 142 and the gear 152.

Unlike the TPOS detector 166, which uses fixed thresholds, the precision rotation detector 170 continually makes adjustments of thresholds to provide the precision rotation detector output signal 170a with better accuracy of edge placements of the precision rotation detector output signal 170a relative to physical positions of gear teeth, and edges of gear teeth in particular.

A multiplexer 174 can be coupled to receive the TPOS output signal 166a and coupled to receive the precision rotation detector output signal 170a. Select logic 172 can provide a selection signal 172a, received by the multiplexer/output module 174. Depending upon the state of the selection signal 172a, the multiplexer 174 is configured to generate a signal 174a representative of a selected one of the TPOS output signal 166a or the precision rotation detector output signal 170a.

The signal 174a is representative of rotation of the gear 152 of FIG. 3, and thus, is also referred to herein as a "rotation signal." In some embodiments, the rotation signal has a first state associated with a gear tooth and a second different state associated with a valley in the gear 152.

The select logic 172 can be coupled to receive the TPOS output signal 166a. In some exemplary embodiments, the select logic 172 selects the signal 174a to be representative of the TPOS output signal 166a for a predetermined amount of time after the gear 152 starts rotating as indicated by the TPOS output signal 166a. Thereafter, the select logic 172 selects the signal 174a to be representative of the precision rotation detector output signal 170a.

Other magnetic field sensors can include only the TPOS channel having the TPOS detector 166 or only the precision rotation detector channel having the precision rotation detector 170.

An output format module 176 can be coupled to receive the signal 174a and configured to generate a signal 176a, which can be an output part of a bidirectional signal 176a. A received part of the bidirectional signal 176a can be a command signal described more fully below.

The signal 176a can be provided in a variety of signal formats, including, but not limited to, a SENT format, an I2C format, a PWM format, a three-state format, or a two-state format native to the TPOS output signal 166a and to the precision rotation detector output signal 170a.

The electronic circuit 160 can also include a self-test module 178. The self-test module 178 can be coupled to receive the amplified (proximity) signal 164a. In some embodiments, the self-test module 178 is also coupled to receive a signal 170b from the precision rotation detector 170. The signal 170b can be representative of a threshold signal generated within the precision rotation detector 170. In some embodiments, the self-test module 178 is also coupled to receive a control signal 171a from the calibration/running mode control module 171, which is indicative of whether the precision rotation detector 170 is in the calibration mode or in the running mode following the calibration mode. In some embodiments, the self-test module 178 is also coupled to receive the gain controlled signal 164a.

The self-test module 178 is configured to generate a self-test signal 178a. In some embodiments, the self-test signal 178a is a multi-bit digital signal representative of an analog-to-digital conversion of all of, or parts of, the amplified proximity signal 164a. In some other embodiments, the self-test signal 178a is a two-state signal representative of a passing condition or a failing condition of the magnetic field sensor 160. In still other embodiments, the self-test signal 178a is a signal having more than two states representative of more than two self-test conditions of the magnetic field sensor 160, for example, a passing condition, a failing condition, and one or more marginal conditions.

The output format module 176 can be coupled to receive the self-test signal 178a. In some embodiments, the output format module 176 is configured to provide as an output part of the bidirectional signal 176a, either the rotation signal 174a (indicative of rotation of the gear 152) or the self-test signal 178a (representative of a self-test condition of the magnetic field sensor 140 or of the gear 152 of FIG. 3), as selected by a command signal received as a command part of the bidirectional signal 176a. To this end the self-test module 178 can be coupled to receive a command signal 176b from the output format module 176, which can command the self-test module 178 to perform one or more self-test functions associated with the self-test signal 178a.

The magnetic field sensor 160 can also include a power-on sensing module 180 configured to generate a power-on signal 180a. In some embodiments, the power-on signal 180a can be a two state signal with a first state representative of a time from a power on of the magnetic field sensor 160 to a predetermined time after the power on, and with a second state representative of a time after the predetermined time.

In view of the above, it will be understood that the bidirectional signal 176a can include a received command portion, an output portion representative of the self-test signal 178a, and another output portion representative of the signal 174a generated by the processing module. In some embodiments, all three components of the bidirectional signal 176a can exist at the same time.

It will also be understood that the output portion of the bidirectional signal 176a representative of the self-test signal 178a can be provided in response to one or more signals. In some embodiments, the output portion of the bidirectional signal 176a representative of the self-test signal 178a is generated a result of a received command portion of the bidirectional signal 176a. In some other embodiments, the output portion of the bidirectional signal 176a representative of the self-test signal 178a is generated a result of the power-on signal 180a. In some other embodiments, the output portion of the bidirectional signal 176a representative of the self-test signal 178a is generated in response to the control signal 171a. In some other embodiments, the output portion of the bidirectional signal 176a representative of the self-test signal 178a is generated from time to time, for example, on every rising edge of the rotation signal 174a, or on every Mth rising edge of the rotation signal 174a.

It will still further be understood that, when the output portion of the bidirectional signal 176a is not representative of the self-test signal 178a, then the output portion of the bidirectional signal 176a can be representative of only the rotation signal 174a generated by the processing module.

Referring now to FIG. 3B, another exemplary magnetic field sensor 200 is responsive to a gear 212 having gear teeth, e.g., gear teeth 212a, 212b, 212c. The magnetic field sensor 200 includes two magnetic field sensing elements 202, 204 coupled to an electronic circuit 208. In some embodiments, the two magnetic field sensing elements 202, 204 are separated in a direction perpendicular to an axis 214 and parallel to a gear by a distance between about 1.5 millimeters and about 3.0 millimeters. In other embodiments, the magnetic field sensing elements 202, 204 can be separated by a distance between about 0.5 millimeters and 1.5 millimeters. In other embodiments, the magnetic field sensing elements can be separated by more than 3.0 millimeters.

The two magnetic field sensing elements 202, 204 and the electronic circuit 208 can be disposed upon (i.e., integrated within or upon) a substrate 206. Here, the magnetic field sensing elements 202, 204 are shown to be Hall elements with an exaggerated size for clarity. The magnetic field sensor 200 can also include a magnet 210. The magnet 210 is configured to generate a magnetic field, which is generally directed along the axis 214 at the position of the magnetic field sensing elements 202, 204. The electronic circuit 200 is configured to generate an output signal (not shown). Let it suffice here to say that the electronic circuit 200 generates a difference of two differential proximity signals 202a, 202b, and 204a, 204b. For reasons described more fully below, the magnetic field sensor 200, using the differencing arrangement, forms an edge detector, able to detect passing edges of gear teeth, but unable to differentiate a gear tooth from a gear valley.

The output signal, when the gear 212 is rotating, is indicative speed of rotation of the gear 212 and also indicative of positions of edges of the gear teeth. However, because of the differencing arrangement, for reasons described more fully below, the magnetic field sensor 200 is unable to provide a TPOS function (which must differentiate a gear tooth from a gear valley) When the gear 212 is stationary, the magnetic field sensor 200 is unable to identify whether the magnetic field sensing elements 202, 204 are proximate to a gear tooth or a valley in the gear 212.

The magnet 210 can be comprised of one uniform material, and can have no central core, which is shown and described in conjunction with FIG. 3. However, in other embodiments, the magnet 210 can have a central core the same as or similar to that shown and described in FIG. 3.

As described above in conjunction with FIG. 3, the central core 150 results in a low baseline when the magnetic field sensing element 142 of FIG. 3 is proximate to a valley in the gear 152. However, the magnetic field sensor 200 uses two magnetic field sensing elements, generating a respective two differential output signals 202a, 202b and 204a, 204b. As described below in conjunction with FIG. 3C, signals representative of the two differential output signals 202a, 202b and 204a, 204b are subtracted in the electronic circuit 208. Thus, when the two magnetic field sensing elements 202, 204 are proximate to a valley in the gear 212, the low baseline is achieved due to the differencing arrangement, since the two magnetic field sensing elements 202, 204 experience the same magnetic field. Also, when the two magnetic field sensing elements 202, 204 are proximate to a gear tooth, e.g., 212a, 212b, 212c, the low baseline is also achieved, since the two magnetic field sensing elements 202, 204 again experience the same magnetic field. Only when the two magnetic field sensing elements 202, 204 experience different magnetic fields does a difference between the two differential signals 202a, 202b and 204a, 204b result in a higher value.

The higher value may occur when one of the magnetic field sensing elements is proximate to a valley in the gear 212 and the other magnetic field sensing element is proximate to a gear tooth, i.e., an edge of one of the gear teeth is between the two magnetic field sensing elements 202, 204. For this reason, the magnetic field sensor 200, having two magnetic field sensing elements used in a differential arrangement, is sometimes referred to as an "edge detector." The edge detecting behavior makes the magnetic field sensor 200 particularly useful when it is necessary to accurately know the rotational position of the gear, which can be determined by knowledge of positions of the edges of the gear teeth represented by state transitions in the output signal from the magnetic field sensor 200.

The differencing of the two differential signals 202a, 202b and 204a, 204b results in an improved accuracy of the magnetic field sensor 200. For example, the magnetic field sensor 200 is not greatly influenced by external magnetic fields, i.e., noise magnetic fields, that both of the two magnetic field sensing elements 202, 204 experience.

Referring now to FIG. 3C, an exemplary electronic circuit 220 can include amplifiers 226, 228 coupled to receive differential signals 222a, 222b, and 224a, 224b, respectively. The differential signal 222a, 222b can be the same as or similar to the differential signal 202a, 202b and the differential signal 224a, 224b can be the same as or similar to the differential signal 204a, 204b generated, respectively, by the magnetic field sensing elements 202, 204 of FIG. 3B. The amplifiers 226, 228 are configured to generate amplified signals 226a, 228a, respectively.

The amplified signals 226a, 228a are received by a differencing module 230, which is configured to generate a difference signal 230a. Characteristics and behaviors of the difference signal 230a will be understood from the discussion above.

The electronic circuit 220 includes only the precision rotation detector channel described above in conjunction with FIG. 3A. An AGC 232 can be the same as or similar to the AGC 168 of FIG. 3A, a precision rotation detector 234 can be the same as or similar to the precision rotation detector 170 of FIG. 3A, and a calibration/running mode control module 235 can be the same as or similar to the calibration/running mode control module 171 of FIG. 3A. The precision rotation detector 234 can generate a precision rotation detector output signal 234a.

The magnetic field sensor 220 can also include an output format module 236, a self-test module 238, and a power-on sensing module 240, which can be the same as or similar to the output format module 176, the self-test module 178, and the power-on module 180 of FIG. 3A.

Referring now to FIG. 3D, another exemplary conventional magnetic field sensor 260 is responsive to a gear 274 having gear teeth, e.g., gear teeth 274a, 274b, 274c. The magnetic field sensor 260 includes three magnetic field sensing elements 262, 264, 266 coupled to an electronic circuit 270. In some embodiments, the magnetic field sensing elements 262, 264 are separated in a direction perpendicular to an axis 276 by a distance between about 1.5 millimeters and about 3.0 millimeters, and the magnetic field sensing element 266 is located midway between the magnetic field sensing elements 262, 264. In other embodiments, the magnetic field sensing elements 262m 264 can be separated by a distance between about 0.5 millimeters and 1.5 millimeters. In other embodiments, the magnetic field sensing elements 262, 264 can be separated by more than 3.0 millimeters.

The three magnetic field sensing elements 262, 264, 266 and the electronic circuit 270 can be disposed upon (i.e., integrated within or upon) a substrate 268. Here, the magnetic field sensing elements 262, 264, 266 are shown to be Hall elements with an exaggerated size for clarity. The magnetic field sensor 260 can also include a magnet 272. The magnet 272 is configured to generate a magnetic field, which is generally directed along an axis 276 at the position of the magnetic field sensing elements 262, 264, 266.

The electronic circuit 270 is configured to generate an output signal (not shown). An exemplary electronic circuit 270 is described below in conjunction with FIG. 3E. Let it suffice here to say that the electronic circuit 270, like the electronic circuit 220 of FIG. 3C above, generates a difference of signals. Thus, for reasons described above, the magnetic field sensor 260 is an edge detector and not a tooth detector.

The output signal, when the gear 274 is rotating, is indicative speed of rotation of the gear 274, indicative of positions of edges of the gear teeth, and can also be indicative of a direction or rotation of the gear 274. However, for reasons described more fully above, the magnetic field sensor 260 is unable to provide a TPOS function, and, when the gear 274 is stationary, is unable to identify whether the magnetic field sensing elements 262, 264, 266 are proximate to a gear tooth or a valley in the gear 274.

The magnet 272 can be comprised of one uniform material, and can have no central core, which is shown and described in conjunction with FIG. 3. However, in other embodiments, the magnet 272 can have a central core the same as or similar to that shown and described in conjunction with FIG. 3.

The differencing of pairs of three differential signals 262a, 262b, and 264a, 264b, and 266a, 266b results in an improved accuracy of the magnetic field sensor 260. For example, like the magnetic field sensor 200 of FIG. 3B, the magnetic field sensor 260 is not greatly influenced by external magnetic fields, i.e., noise magnetic fields, that the three magnetic field sensing elements 262, 264, 266 experience.

Referring now to FIG. 3E, an exemplary electronic circuit 280 can be the same as or similar to the electronic circuit 220 of FIG. 3D. The electronic circuit 280 can include amplifiers 288, 290, 292 coupled to receive differential signals 282a, 282b, and 284a, 284b, and 286a, 286b, respectively. The differential signal 282a, 282b can be the same as or similar to the differential signal 262a, 262b, the differential signal 284a, 284b can be the same as or similar to the differential signals 264a, 264b, and the differential signal 286a, 286b can be the same as or similar to the differential signal 266a, 266b generated, respectively, by the magnetic field sensing elements 262, 264, 266 of FIG. 3D. The amplifiers 288, 290, 292 are configured to generate amplified signals 288a, 290a, 292a, respectively.

The amplified signals 288a, 292a are received by a first differencing module 294, which is configured to generate a first difference signal 294a. The amplified signals 290a, 292a are received by a second differencing module 296, which is configured to generate a second difference signal 296a. Characteristics and behaviors of the difference signals 294a, 296a will be understood from the discussion above.

The electronic circuit 280 includes only precision rotation detector channels described above in conjunction with FIG. 3A. Only one of the two precision rotation detector channels is described herein as being representative of the other precision rotation detector channel. An AGC 290 can be the same as or similar to the AGC 168 of FIG. 3A, a precision rotation detector 302 can be the same as or similar to the precision rotation detector 170 of FIG. 3A, and a calibration/running mode control module 305 can be the same as or similar to the calibration/running mode control module 171 of FIG. 3A.

The precision rotation detector 302 can generate a precision rotation detector output signal 302*a*.

A speed/direction module 306 can be coupled to receive the precision rotation detector output signal 302*a* and also another precision rotation detector output signal 304*a*. The speed/direction module 306 is configured to generate an output signal 306*a* representative of a speed of rotation and a direction of rotation of the gear 274. It will be understood that the direction information can be determined by way of a phase difference of the two precision rotation detector output signals 302*a*, 304*a*, and the speed information can be determined by way of a frequency of either one of the two precision rotation detector output signals 302*a*, 304*a*.

The electronic circuit 280 can also include an output format module 308, a self-test module 310, and a power-on sensing module 312, which can be the same as or similar to the output format module 176, the self-test module 178, and the power-on module 180 of FIG. 3A.

The self-test module 310 can be coupled to receive more signals than the self-test module 238 of FIG. 3C. Namely, the self-test module 310 can be coupled to receive first and second proximity signals 294*a*, 296*aa*, respectively, first and second threshold signals 302*b*, 304*b*, respectively, and first and second gain controlled (AGC0) signals 298*a*, 300*a*, respectively. The additional signals represent a replication of self-test functions (such as those described below in conjunction with FIG. 4) within the self-test module 310.

While magnetic field sensors described above in conjunction with FIGS. 3-3E are shown to include respective automatic gain control circuits (AGCs) configured to generate respective gain controlled signals, in other embodiments, the AGCs can be replaced by fixed gain amplifiers or buffers, in which case, the gain controlled signals are replaced by fixed gain signals. For embodiments in which the gain of the amplifiers are fixed, it should be understood that the gain of the amplifiers can be greater that one, less than one, or one. Both the gain controlled signals and the fixed gain signals are referred to herein as "magnetic-field-responsive signals," which are representative of, or the same as, the proximity signals.

Figure 4:
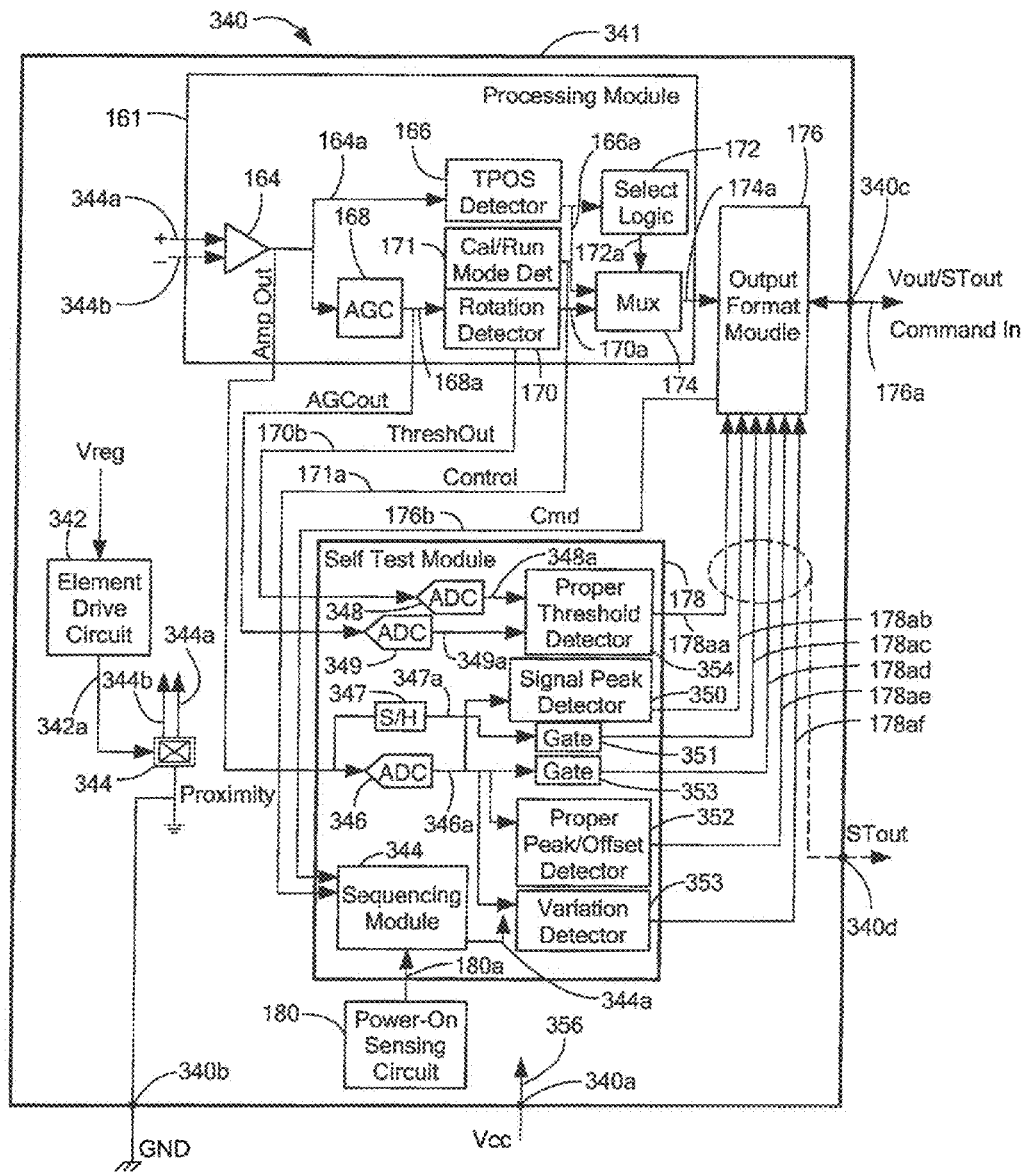
FIG. 4 is a block diagram of a magnetic field sensor showing an expanded view of a self-test module.

Referring now to FIG. 4, in which like elements of FIGS. 3 and 3A are shown having like reference designations, a magnetic field sensor 340 can include the processing module and the self-test module 178 of FIG. 3A. Here, the self-test module 178 is shown in greater detail.

The magnetic field sensor 340 can include a Hall Effect element 344 configured to generate a differential signal 344*a*, 344*b*, which is received by the processing module. The Hall Effect element 344 can be coupled to receive drive signals 342*a* from an element drive circuits 342.

The magnetic field sensor 340 can include a plurality of nodes or lead frame pins. A first node 340*a* is coupled to receive a power supply voltage, Vcc. A second node 340*b* is coupled to ground. A third node 340*c* provides the bidirectional signal 176*a*, which, at some times includes an output portion representative of rotation of the gear 152 of FIG. 3, at some other times includes an output portion representative of a self-test of the magnetic field sensor 340, and at some other times includes an input portion comprising a command signal from outside of the magnetic field sensor 340.

It should be recognized that detailed aspects of the self-test module 178 can be implemented with microcode instructions and a micro machine, or the detailed aspects can be implemented in gates, as may be generated, for example, by a hardware description language (HDL).

As described above in conjunction with FIG. 3A, the self-test module 178 can be coupled to receive one or more of the amplified proximity signal 164*a*, the gain controlled (AGC) signal 168*a*, the threshold signal 170*b*, the control signal 171*a*, or the power on signal 180*a*.

In one self-test aspect described more fully below, the self-test module 178 can include an analog-to-digital converter (ADC) coupled to receive the amplified signal 164*a*, which is an analog signal, and convert the amplified signal 164*a* to a digital signal 346*a*. The self-test module 178 can include a signal peak detector 350 coupled to receive the converted signal 346*a* and configured to generate an output signal 178*ab* representative of peak values of the converted signal 346*a*.

In another self-test aspect described more fully below, the self-test module 178 can include a sample and hold circuit 347 coupled to receive the proximity signal 164*a* and configured to generate a plurality of analog samples within a signal 347*a*. A gate circuit 351, or switch circuit, can be coupled to receive the signal 347*a*. The gate circuit 351 is configured to generate an output signal 178*ac* from the gate circuit 351 representative of analog samples within the signal 347*a*.

In other self-test aspect described more fully below, the self-test module 178 can include another gate circuit 353, or switch circuit, coupled to receive the converted signals 346*a*. The gate circuit 353 is configured to generate an output signal 178*ad* representative of all of or selected ones of digital samples within the signal 346*a*.

In another self-test aspect, described more fully below, the self-test module 178 can include a proper peak/proper DC offset detector 352 coupled to receive the converted signal 346*a* (also referred to herein as a proximity signal). The proper peak/proper DC offset detector 352 can be configured to categorize one or more characteristics of the proximity signal 346*a* into a plurality of potential categories. The plurality of potential categories is representative of a plurality of discrete self-test states of the proximity signal 346*a*. The proper peak/proper DC offset detector 352 is configured to generate a signal 178*ae* representative of at least one of the plurality of potential categories into which at least one of the one or more characteristic values was categorized.

In another self-test aspect described more fully below, the self-test module 178 can include an analog-to-digital converter 348 coupled to receive the threshold signal 170*b* and configured to generate a converted signal 348*a*. The self-test module 178 can also include an analog-to-digital converter 349 coupled to receive the gain controlled signal 168*a* and configured to generate a converted signal 349*a*. The self-test module 178 can include a proper threshold detector 354 coupled to receive the converted signal 348*a* and coupled to receive the converted signal 349*a*. The proper threshold detector 354 is configured to identify a plurality of peak values of the gain controlled signal 168*a*, configured to identifying a plurality of threshold values of the threshold signal 170*b*, configured to generate one or more difference values by differencing the identified peak values and associated identified threshold values, and configured to categorize the one or more difference values into a plurality of potential categories. The plurality of potential categories is representative of a plurality of self-test states of the proximity signal. The proper threshold detector 354 is configured to generate a signal 178*aa* representative of at least one of the plurality of potential categories into which at least one of the one or more characteristic values was categorized.

In another self-test aspect described more fully below, the self-test module 178 can include a variation detector 353 coupled to receive the converted signal 346*a*. The variation detector is configured to identify one or more variation values of the converted signal 346*a*, i.e., of the proximity signal 164a. The variation values can include, but are not limited to, values representative of a variation of peak-to-peak values, values representative of a variation of (positive and/or negative) peak values, values representative of a variation of mean values (i.e., DC offset values), or values representative of a variation of root-mean-square (rms) values. In some embodiments, the variation values are standard deviation values. The variation detector 353 is configured to generate a signal 178*af* representative of the one or more variation values.

In view of the above, the self-test module 178 is configured to generate any one or more of self-test signals 178*aa*, 178*ab*, 178*ac*, 178*ad*, 178*ae*, 178*af*.

In some embodiments, the self-test module 178 includes a sequence module 344 configured to generate a sequence signal 344*a*. The sequence signal 344*a* can cause any one or more of self-test signals 178*aa*, 178*ab*, 178*ac*, 178*ad*, 178*ae* to be generated in any sequence. However, in other embodiments, the self-test module 178 generates only one of the self-test signals 178*aa*, 178*ab*, 178*ac*, 178*ad*, 178*ae*, 178*af*, and portions of the self-test module 178 that are not used are omitted.

Any one or more of the self-test signals 178*aa*, 178*ab*, 178*ac*, 178*ad*, 178*ae*, 178*af* can be communicated to the output format module 176, and any one or more of the self-test signals 178*aa*, 178*ab*, 178*ac*, 178*ad*, 178*ae*, 178*af* can be communicated within a self-test signal portion of the bidirectional signal 176*a*. As described above, the self-test signal portion of the bidirectional signal 176*a* can be generated under control of one or more of the plurality of control signals, for example, under control of the power on the control signal 180*a*, under control of the control signal 171*a*, or under control of the command portion of the bidirectional signal 176*a*. The command portion of the bidirectional signal 176*a* can be communicated to the self-test module 178 via a command signal 176*b*.

In some alternate embodiments, any one or more of the self-test signals 178*aa*, 178*ab*, 178*ac*, 178*ad*, 178*ae*, 178*af* can be communicated to another node 340*d*, or lead frame pin. Communication of any one or more of the self-test signals 178*aa*, 178*ab*, 178*ac*, 178*ad*, 178*ae*, 178*af* to the node 340*d* can occur either in combination with the communication of any one or more of the self-test signals 178*aa*, 178*ab*, 178*ac*, 178*ad*, 178*ae*, 178*af* within the self-test portion of the bidirectional signal 176*a* or instead of the communication within the self-test portion of the bidirectional signal 176*a*.

Referring briefly to FIG. 3E, it will be understood that the various modules of the self-test module 178 can be replicated with the self-test module 310 of FIG. 3E to accommodate a second precision rotation detector.

While the magnetic field sensor 341 described above in conjunction with FIG. 4 is shown to include an automatic gain control circuit (AGC) 168 configured to generate a respective gain controlled signal 168*a*, in other embodiments, the AGC 168 can be replaced by a fixed gain amplifier or buffer. Thus, gain controlled signals described in figures below can be replaced by a fixed gain signals.

Figures 5, 5A:
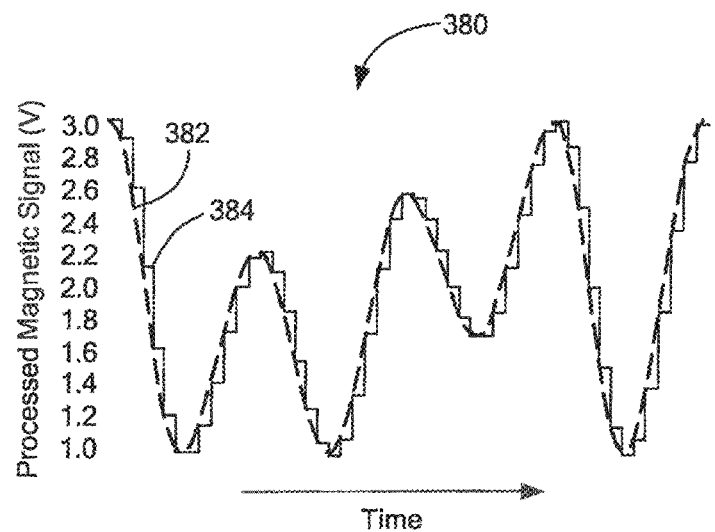
FIG. 5 is a graph showing a proximity signal generated by a magnetic field sensor.
FIG. 5A is a chart showing three groups of values representative of aspects of the proximity signal of FIG. 5.

Referring now to FIG. 5, a graph 380 has a vertical axis with a scale in units of volts and a horizontal axis with a scale in units of time in arbitrary units. A signal 382 is representative of the amplified signal 164*a* (i.e., proximity signal) of FIGS. 3A and 4. However, the signal 382 can also be representative of the amplified signals 230*a*, 294*a*, 296*a* of FIGS. 3C and 3E.

As described above, the signal 382 has positive and negative peaks corresponding to gear teeth and valleys in a gear when the gear is rotating. As shown, the amplified signal 382 can have fluctuations in DC offset, fluctuations in peak amplitude, and fluctuations in peak-to-peak amplitudes as the gear rotates. The fluctuations can result from the above described wobble and/or from the above described radial asymmetry of the gear as it rotates.

A signal 384, here shown in analog form, is representative of digitized values of the amplified signal 382 as generated by an analog-to-digital converter, for example, the analog-to-digital converter 346 of FIG. 4.

As described above, in some embodiments, digital values (i.e., the converted signal 346*a* of FIG. 4) of which the signal 384 is representative, are communicated by the self-test module 178, for example, to the engine control processor in an automobile for analysis of the magnitudes of the fluctuations of the signal 384. If the fluctuations are large enough, the engine control processor can give an indication of a failure.

Referring now to FIG. 5A, a first list of numbers 390 is representative of analog values of the signal 382 of FIG. 5 (i.e., samples of the analog proximity signal 164*a* of FIG. 4) at different respective times. In some embodiments, the magnetic field sensors described above can provide the sampled analog values 390 as self-test signal 178*ac* of FIG. 4.

A second list of numbers 400 is representative of digital values corresponding to the values of the signal 384 of FIG. 5 (i.e., the converted signal 346*a* of FIG. 4) at different respective times. In some embodiments, the magnetic field sensors described above can provide the digital values 400 as the self-test signal 178*ad* of FIG. 4.

A third list of numbers 410 is representative of positive and negative peaks of the signal 384 of FIG. 5 at different respective times. In some embodiments, the magnetic field sensors described above can provide the positive and negative peak values 410 as the self-test signal 178*ab* of FIG. 4.

It should be recognized that the values 390, 400, 410 do not directly identify passing, failing, or marginal conditions of the magnetic field sensors that generate the values. Another processor, for example, the above-described engine control processor, receives the values and makes the determination.

It should be appreciated that flowcharts shown below correspond to the below contemplated technique which would be implemented in a magnetic field sensor, e.g., the magnetic field sensor 340 of FIG. 4. Rectangular elements (typified by element 422 in FIG. 6), herein denoted "processing blocks," represent computer software instructions or groups of instructions or gate level hardware equivalents. Diamond shaped elements, herein denoted "decision blocks," represent computer software instructions, or groups of instructions, or gate level hardware equivalents, which affect the execution of the computer software instructions represented by the processing blocks.

In some embodiments, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Figure 6:
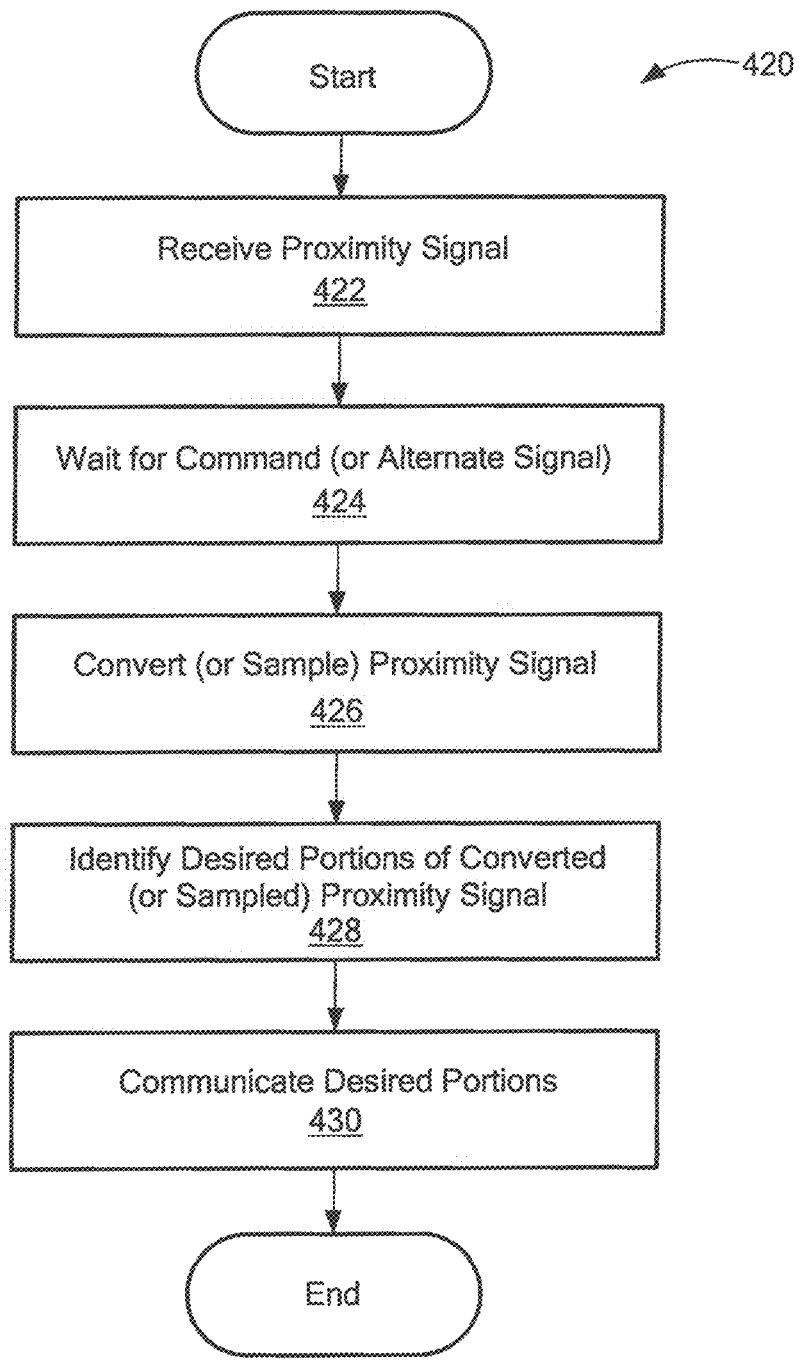
FIG. 6 is a flow chart showing a method of communicating the groups of values of FIG. 5A.

Referring now to FIG. 6, a method 420 is associated with the self-test signals 178ab, 178ac, 178ad of FIG. 4 and associated with the values 390, 400, 410 of FIG. 5A.

The method 420 begins at block 422, where the proximity signal, for example, the proximity signal 164a of FIG. 4, is received, for example, by the self-test module 178 of FIG. 4. At block 424, the method 420 waits for either a command portion of the bidirectional signal 176a of FIG. 4, or alternatively, waits for a particular state of a particular state of one of the alternate control signals, for example, the power on signal 180a of FIG. 4 or the control signal 171a of FIG. 4.

At block 426, upon receiving the command or alternate signal at block 422, the method converts, or alternatively samples, the proximity signal 164a of FIG. 4.

At block 428, the process identified desired portions of the converted or sampled signal. In some embodiments, the desired portions are all of the converted or sampled signal. In some embodiments, the desired portions are fewer than all of the converted or sampled signal.

At block 430, desired portions of the converted or sampled signal are communicated, for example, within one or more of the self-test signals 178aa, 178ab, 178ac of FIG. 4.

It will be appreciated from discussion above that the desired portions of the converted or sampled signal can include digital samples of the proximity signal 164a or analog samples of the proximity signal 164a. The desired portions of the converted or sampled signal can include only some of the samples, for example, only peak values, or the desired portions of the converted or sampled signal can include substantially all of the samples of the proximity signal.

Figure 7:
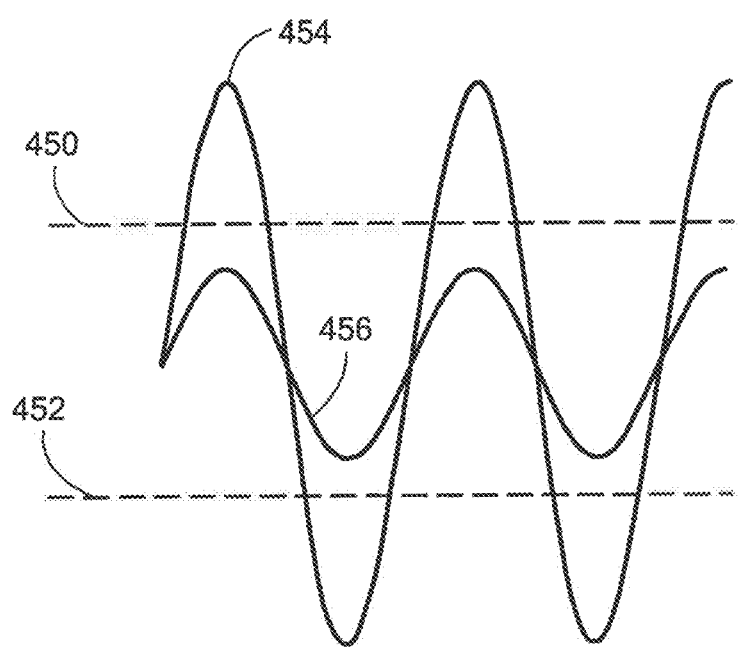
FIG. 7 is a graph showing a proximity signal generated by a magnetic field sensor having two amplitudes, and also showing two amplitude thresholds.

Referring now to FIG. 7, in some embodiments, the proper peak/proper DC offset detector 352 described above uses two predetermined self-test thresholds 450, 452 to identify amplified signals (e.g., the amplified or proximity signal 164a of FIGS. 1A and 4) that have sufficient amplitude. An amplified signal 456, which does not cross the self-test thresholds 450, 452, has too low of an amplitude and can be identified by the above-described proper peak/proper DC offset detector 352 to be indicative of a failing condition. An amplified signal 454, which does cross the self-test thresholds 450, 452, has an acceptable amplitude and can be identified by the above-described proper peak/proper DC offset detector 352 to be indicative of a passing condition. The passing or failing conditions can be communicated in the self-test signal 178ae of FIG. 4.

Figure 8:
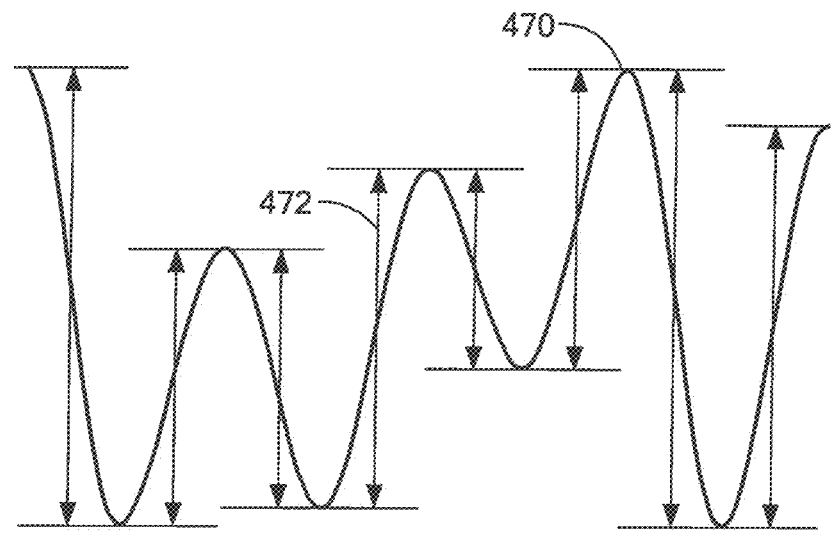
FIG. 8 is a graph showing a proximity signal generated by a magnetic field sensor having a varying peak-to-peak amplitude.

Referring now to FIG. 8, an amplified signal 470 is representative of amplified signals above (e.g., the amplified or proximity signal 164a of FIGS. 1A and 4). The amplified signal has the fluctuations described above in conjunction with FIG. 5. Peak-to-peak amplitudes are shown by arrows, e.g., arrow 472, on each half cycle of the amplified signal 470.

Figure 8A:
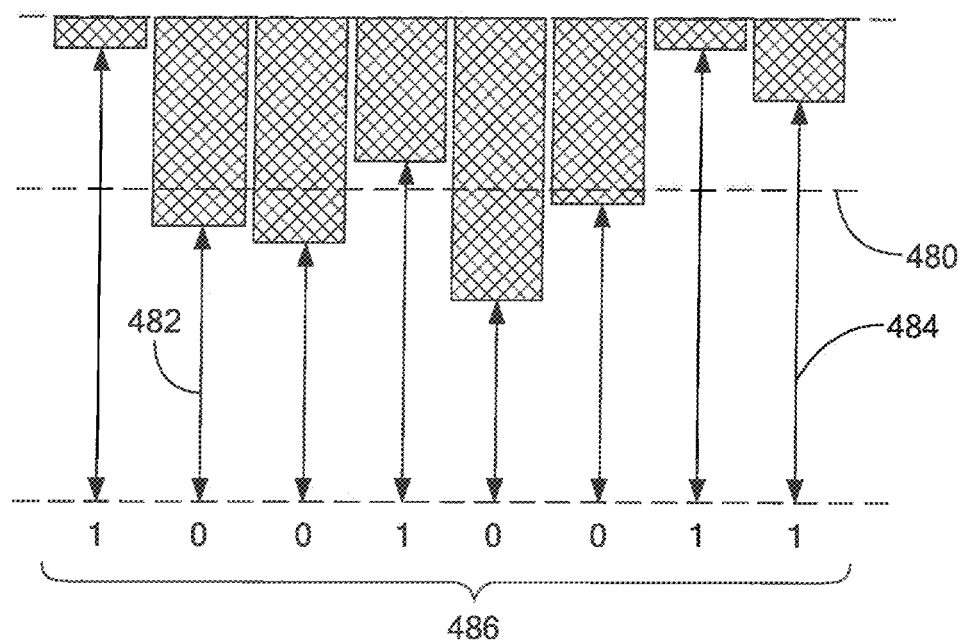
FIG. 8A is a graph showing the proximity signal of FIG. 8 having the varying amplitude and showing the varying peak-to-peak amplitude categorized into two discrete ranges.

Referring now to FIG. 8A, the peak-to-peak amplitudes of cycles of the amplified signal 470 of FIG. 8 are compared with a predetermined self-test threshold 480. Peak-to-peak amplitudes above the self-test threshold 480 are categorized as being indicative of a passing condition and peak-to-peak amplitudes below the self-test threshold 480 are categorized as being indicative of a failing condition.

The term "characteristic value" is used in conjunction with FIG. 8A to indicate peak-to-peak values.

Exemplary category values 486 are indicative of the passing and failing conditions of the characteristic values, i.e., the peak-to-peak values, of the amplified signal 470 of FIG. 5. Within the exemplary category values 486, a category value of zero is indicative of a failing condition and a category value of one is indicative of a passing condition. However, in other embodiments, lower category values can be indicative of the passing condition.

In some embodiments, the category values 486 are identified by and communicated by the above-described proper peak/proper DC offset detector 352 of FIG. 4. The category values 486 can be communicated in the self-test signal 178ae of FIG. 4. In some embodiments, all of the category values are communicated. In other embodiments, only a category value indicative a worst case category is communicated, here a zero indicative of a failing condition.

It will be understood that, since only one predetermined threshold 480 is used, the process represented by FIG. 8A can directly identify only passing and failing conditions and is unable to identify marginal condition. However, in some embodiments, the category values 486 can be further processed, for example, by the proper peak/proper DC offset detector 352 of FIG. 4 in order to identify marginal conditions. A marginal condition can be identified and communicated, for example, by detecting a rate at which the failures, i.e., category values equal to zero, occur. In other words, category values of zero that occur within a certain range of rates can be indicative of a marginal failure. Thus, in some embodiments, passing conditions, failing conditions, and marginal conditions can be communicated within the self-test signal 178ae of FIG. 4, even when using only one predetermined threshold 480.

Still further, in other embodiments, the category values 486 can be combined, for example, to generate one or more failures (i.e., zero category values) per time value(s), or to generate a total of category values per time. In some embodiments, the combined category values, e.g., the zero category value per time or the total category values per time, are communicated within the self-test signal 178ae of FIG. 4.

Figure 9:
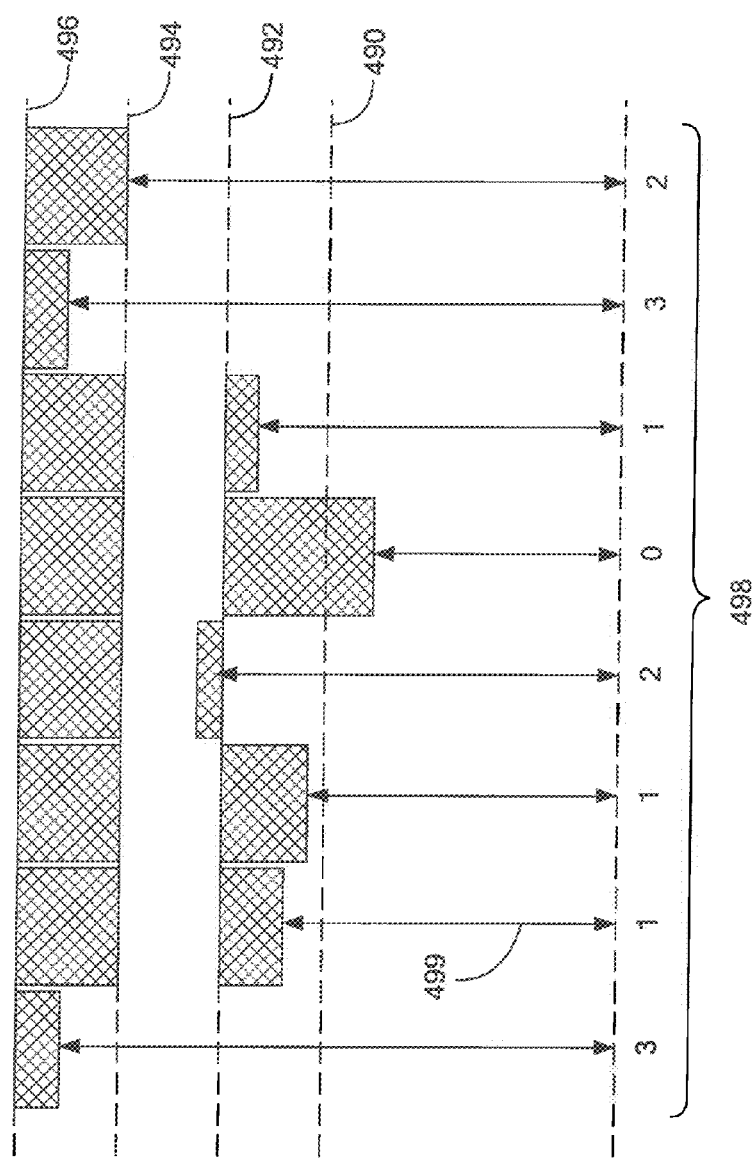
FIG. 9 is a graph showing the proximity signal of FIG. 8 having the varying amplitude and showing the varying peak-to-peak amplitude categorized into four discrete ranges.

Referring now to FIG. 9, the peak-to-peak amplitudes of cycles of the amplified signal 470 of FIG. 8 are compared with a plurality of predetermined self-test thresholds 490, 492, 494, 496. Peak-to-peak amplitudes above the self-test threshold 494 are categorized being indicative of a passing condition. Peak-to-peak amplitudes below the self-test threshold 490 are categorized as being indicative of a failing condition. Peak-to-peak amplitudes between self-test thresholds 490 and 492 are categorized as being indicative of a marginal and unacceptable condition. Peak-to-peak amplitudes between self-test test thresholds 492 and 494 are categorized as being indicative of a marginal but acceptable condition.

The term "characteristic value" is used in conjunction with FIG. 9 to indicate peak-to-peak values.

Category values 498 are indicative of the above-described four possible conditions of the characteristic values, i.e., the peak-to-peak values, of the amplified signal 470 of FIG. 5. Here, a category value of three is indicative of the passing condition, a category value of two is indicative of the marginal but acceptable condition, a category value of one is indicative of the marginal and unacceptable condition, and the category value of zero is indicative of the failing condition.

In some embodiments, the category values 498 are identified by and communicated by the proper peak/proper DC offset detector 352 of FIG. 4 within the self-test signal 178ae of FIG. 4. In some embodiments, all of the category values 498 are communicated. In other embodiments, only a category value indicative a predetermined category is communicated, for example, a zero, a one, or a two.

In other embodiments, the category values are combined, for example, to generate one or more failures (i.e., zero category values) per time value(s), or to generate a total of category values per time. Other combinations per time are also possible. In some embodiments, the combined category values, e.g., the zero category value per time or the total category values per time, are communicated by the above-described proper peak/offset detector 352 of FIG. 4, and upon command, the combined category values are communicated within the self-test signal 178ae of FIG. 4.

Figure 10:
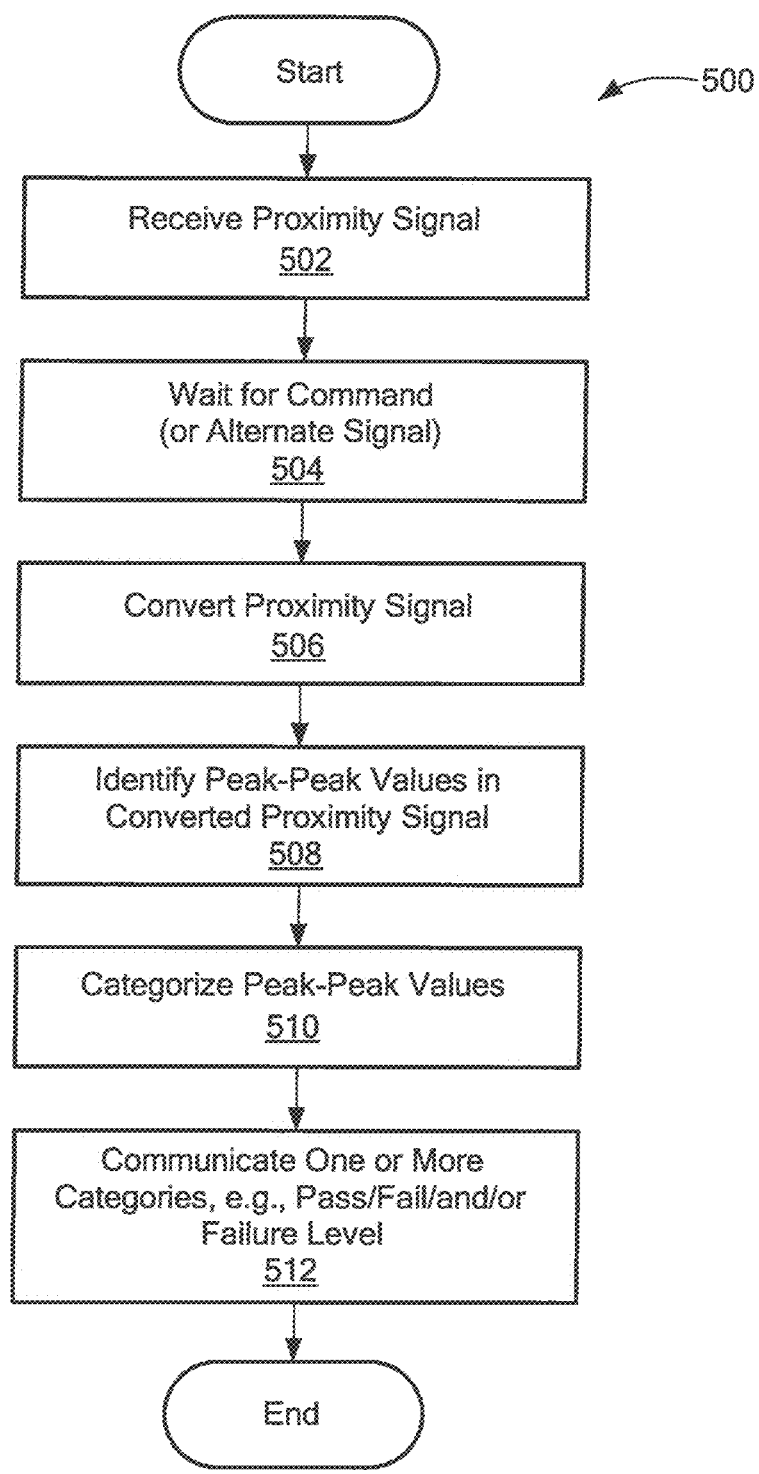
FIG. 10 is a flow chart showing a method of communicating results of a self-test associated with a magnetic field sensor.

Referring now to FIG. 10, a method 500 pertains to the subject matter of FIGS. 7, 8, 8A, and 9.

The method 500 begins at block 502, where the proximity signal, for example, the proximity signal 164a of FIG. 4, is received, for example, by the self-test module 178 of FIG. 4. At block 504, the method 500 waits for either a command portion of the bidirectional signal 176a of FIG. 4, or alternatively, waits for a particular state of one of the alternate control signals, for example, the power on signal 180a of FIG. 4 or the control signal 171a of FIG. 4.

At block 506, upon receiving the command or alternate signal at block 502, the method converts (e.g., converts to digital values) the proximity signal 164a of FIG. 4.

At block 508, the method, i.e., the proper peak/proper DC offset detector 352 of FIG. 4, identifies the peak-to-peak values in the converted proximity signal. Peak-to-peak values are represented for example, by an arrow 499 of FIG. 9.

At block 510, the method categorizes peak-to-peak values into a plurality of categories, for example, pass, fail, and marginal categories.

At block 512, the method communicates categories into which the peak-to-peak values fall, for example, within the self-test signal 178ae of FIG. 4.

Figure 10A:
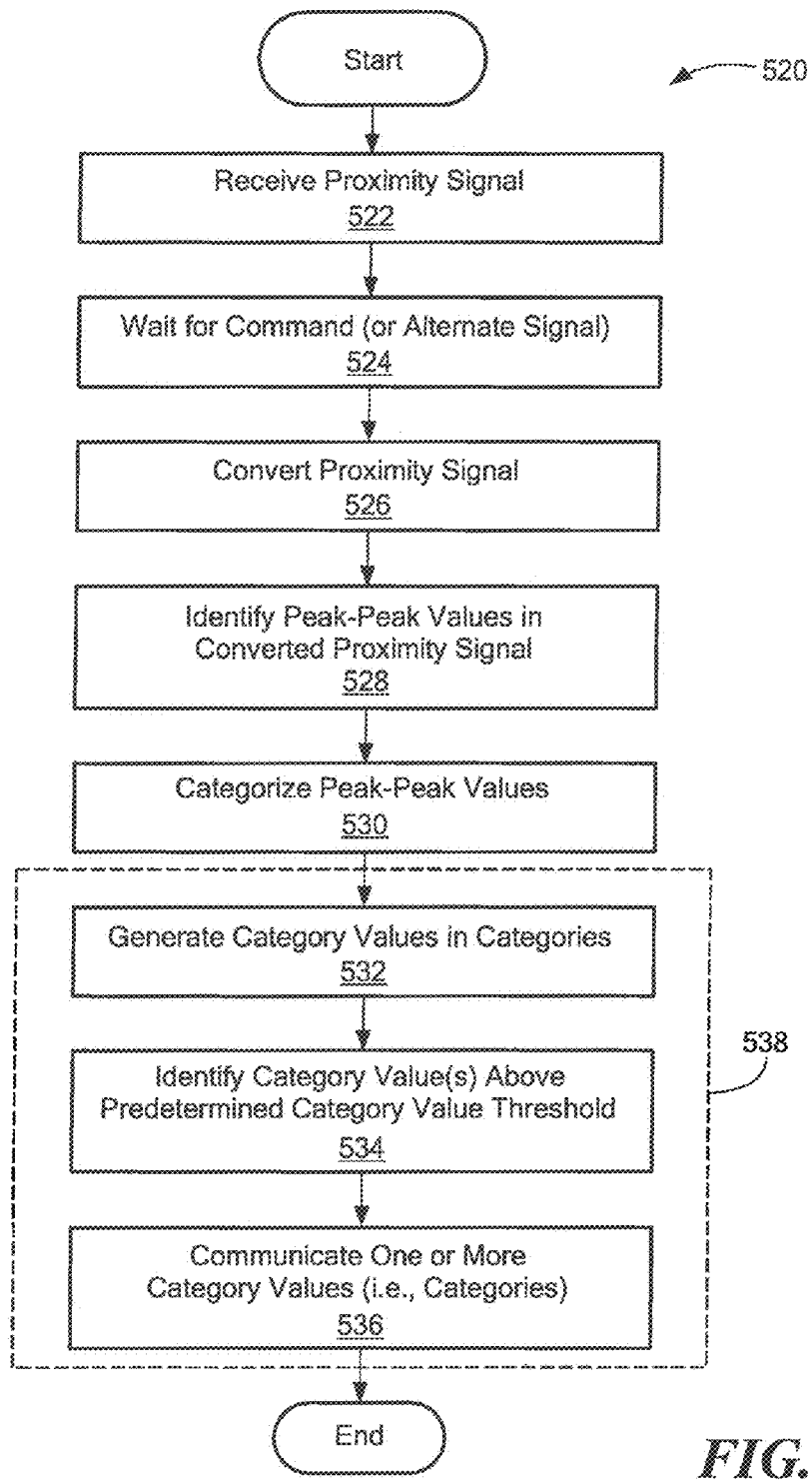
FIG. 10A is a flow chart showing a method of communicating results of another self-test associated with a magnetic field sensor.

Referring now to FIG. 10A, a method 520 pertains to the subject matter of FIGS. 8, 8A, and 9.

The method 520 begins at block 522, where the proximity signal, for example, the proximity signal 164a of FIG. 4, is received, for example, by the self-test module 178 of FIG. 4. At block 524, the method 520 waits for either a command portion of the bidirectional signal 176a of FIG. 4, or alternatively, waits for a particular state of one of the alternate control signals, for example, the power on signal 180a of FIG. 4 or the control signal 171a of FIG. 4.

At block 526, upon receiving the command or alternate signal at block 422, the method converts (e.g., converts to digital values) the proximity signal 164a of FIG. 4.

At block 528, the method, i.e., the proper peak/proper DC offset detector 352 of FIG. 4, identifies the peak-to-peak values in the converted proximity signal. Peak-to-peak values are represented for example, by an arrow 499 of FIG. 9.

At block 530, the method categorizes peak-to-peak values into a plurality of categories, for example, pass, fail, and marginal categories.

Blocks 538 show additional details related to block 512 of FIG. 10.

At block 532, the method generates category values associated with the categories. The category values 498 of FIG. 9 are representative of the category values.

At block 534, the method identifies category values above a predetermined category value threshold. Referring briefly to FIG. 9, the predetermined category value threshold can be zero, one, or two.

At block 536, the method communicates at least one of the plurality of potential categories into which at least one of the one or more characteristic values was categorized that is associated with a category value greater than the predetermined threshold category value. Referring again briefly to FIG. 9, for example, if the predetermined category value threshold is two, categories having measured peak-to peak values with category values of one and zero are communicated.

Figure 11:
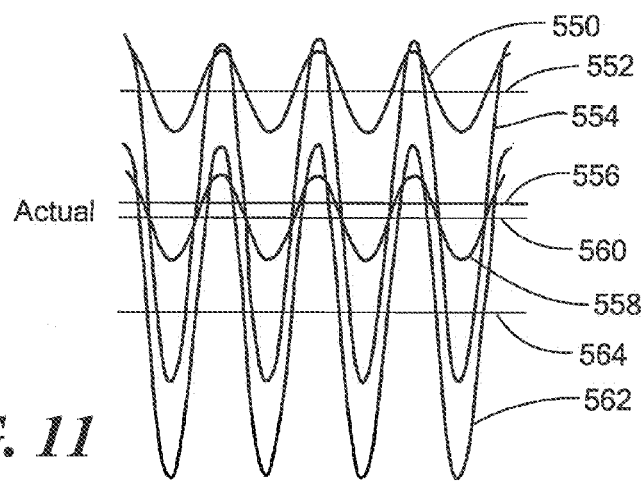
FIG. 11 is a graph showing a proximity signal generated by a magnetic field sensor having a varying peak amplitude and having a varying DC offset.

Referring now to FIG. 11, four signals 550, 554, 558, 562 are representative of the proximity signal 164a of FIG. 4 taken at different times, for example, at different angular rotations of a gear sensed by the magnetic field sensor 340 of FIG. 4, or at different times of the day, or at different operating temperatures.

The four signals 550, 554, 558, 562 have four different characteristic values, here four different mean values (i.e., DC offsets) 552, 556, 560, 564, respectively.

Figure 11A:
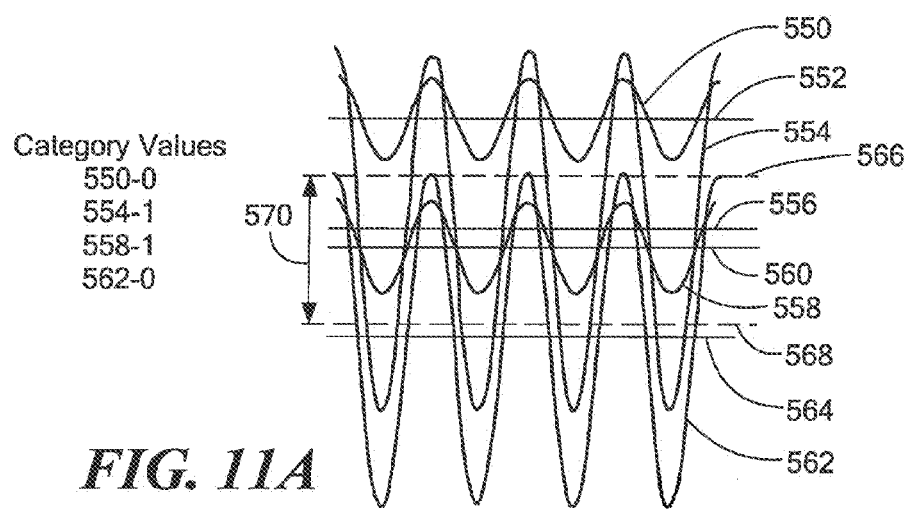
FIG. 11A is a graph representative of a way to categorize the varying DC offset of the proximity signal of FIG. 11.

Referring now to FIG. 11A, in which like elements of FIG. 11 are shown having like reference designations, a range 570 between upper and lower mean value thresholds 566, 568 represents an acceptable range of mean values, within which the mean values 556, 560 fall. Thus, the signals 554, 558 represent signals categorized as passing signals and the signals 550, 562 represent signals categorized as failing signals, i.e., their DC offsets are too large.

Category values are shown for each of the four signals 550, 554, 558, 562.

While only pass and fail categories are represented by the range 570, in other embodiments, there can be additional ranges that are indicative of marginal conditions.

Figure 11B:
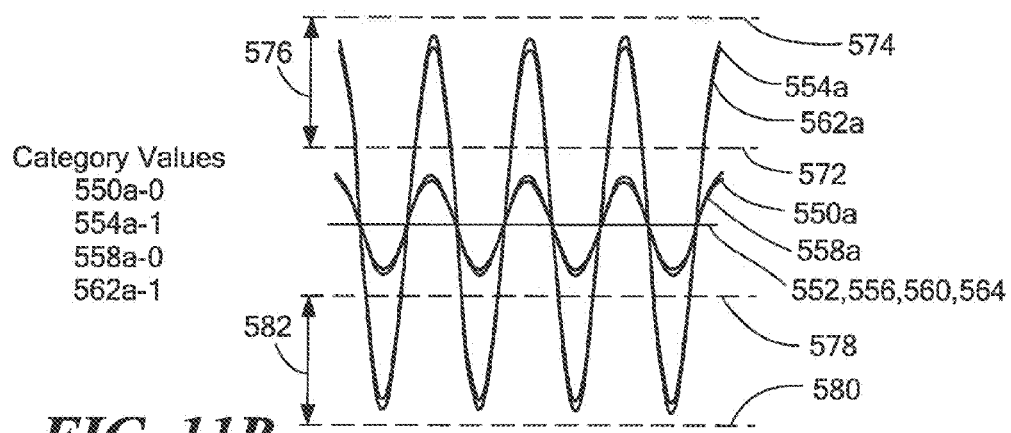
FIG. 11B is a graph representative of a way to categorize the varying peak amplitude of the proximity signal of FIG. 11.

Referring now to FIG. 11B, in which like elements of FIGS. 11 and 11A are shown having like reference designations, the four signals 550, 554, 558, 562 are repositioned (becoming signals 550a, 554a, 558a, 562a) for clarity to show that they have another eight different characteristic values, here four different positive peak values and four different negative peak values, which are also representative of four different peak-to-peak values where the signals 550a, 554a, 558a, 562a are symmetrical.

A range 570 between positive peak thresholds 572, 574 and a range 582 between negative peak thresholds 578, 580 represent acceptable ranges of peak amplitudes of the signals 550a, 554a, 558a, 562a. Thus, the signals 554a, 562a represent signals categorized as passing signals and the signals 550a, 558a represent signals categorized as failing signals, i.e., their amplitudes are too small.

While only pass and fail categories are represented by the ranges 576, 582, in other embodiments, there can be additional ranges that are indicative of marginal conditions.

Category values are shown for each of the four signals 550a, 554a, 558a, 562a.

In some embodiments, only one of the failing conditions of FIGS. 11A, 11B is communicated in the self-test signal 178ae of FIG. 4. In other embodiments, both of the failing conditions of FIGS. 11A, 11B are communicated in the self-test signal 178ae of FIG. 4. Singular arrangements are described below in conjunction with FIGS. 12 and 12A. In still other embodiments, the failing conditions of FIGS. 11A, 11B are further combined and the combination is communicated. Combined arrangements are described more fully below in conjunction with FIG. 12C.

Figure 12:
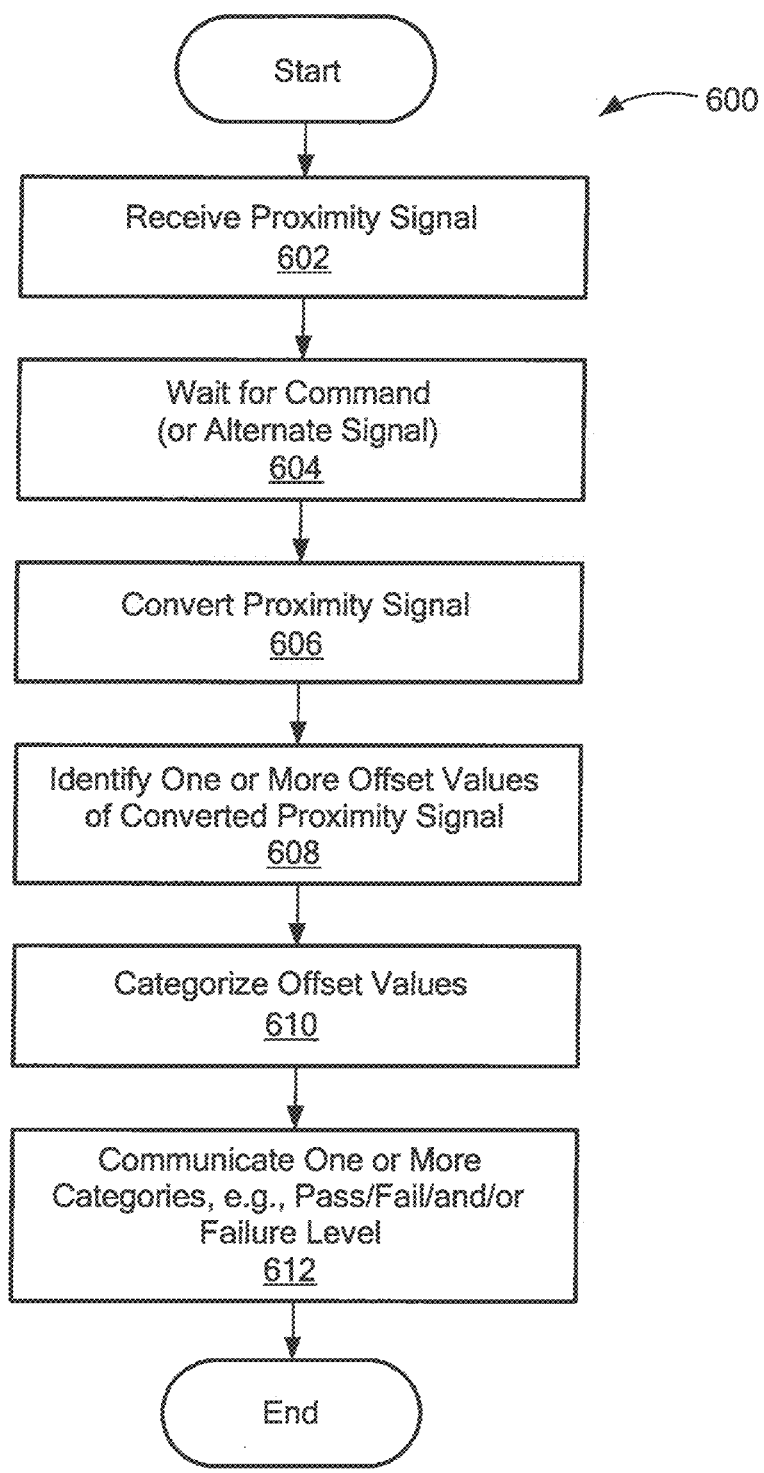
FIG. 12 is a flow chart showing a method of communicating the categorized offset values of FIG. 11A.

Referring now to FIG. 12, a process 600 is representative of use of DC offsets alone as in FIG. 11A.

The method 600 begins at block 602, where the proximity signal, for example, the proximity signal 164a of FIG. 4, is received, for example, by the self-test module 178 of FIG. 4. At block 604, the method 600 waits for either a command portion of the bidirectional signal 176a of FIG. 4, or alternatively, waits for a particular state of one of the alternate control signals, for example, the power on signal 180a of FIG. 4 or the control signal 171a of FIG. 4.

At block 606, upon receiving the command or alternate signal at block 604, the method converts (e.g., converts to digital values) the proximity signal 164a of FIG. 4.

At block 608, the method, i.e., the proper peak/proper DC offset detector 352 of FIG. 4, identifies one or more DC offset values in the converted proximity signal.

At block 610, the method categorizes DC offset values into a plurality of categories, for example, pass, fail, and marginal categories.

At block 612, the method communicates categories, e.g., self-test categories (e.g., category values), into which the DC offset values fall, for example, within the self-test signal 178ae of FIG. 4.

Figure 12A:
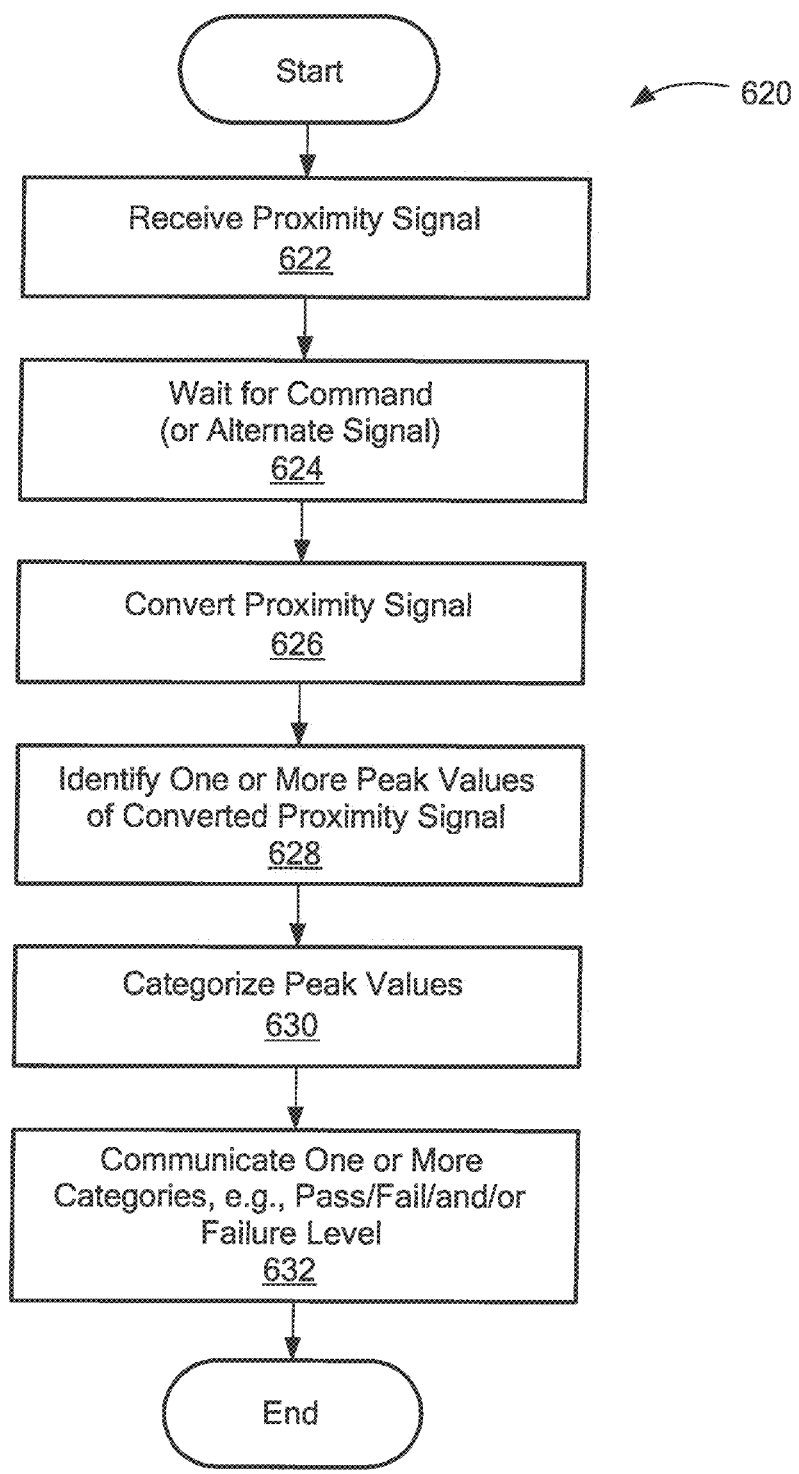
FIG. 12A is a flow chart showing a method of communicating the categorized peak values of FIG. 11B.

Referring now to FIG. 12A, a process 620 is representative of use of positive and negative peak values as in FIG. 11B.

The method 620 begins at block 622, where the proximity signal, for example, the proximity signal 164a of FIG. 4, is received, for example, by the self-test module 178 of FIG. 4. At block 624, the method 620 waits for either a command portion of the bidirectional signal 176a of FIG. 4, or alternatively, waits for a particular state of one of the alternate control signals, for example, the power on signal 180a of FIG. 4 or the control signal 171a of FIG. 4.

At block 626, upon receiving the command or alternate signal at block 624, the method converts (e.g., converts to digital values) the proximity signal 164a of FIG. 4.

At block 628, the method, i.e., the proper peak/proper DC offset detector 352 of FIG. 4, identifies one or more peak values in the converted proximity signal.

At block 630, the method categorizes the peak values into a plurality of categories, for example, pass, fail, and marginal categories.

At block 632, the method communicates categories e.g., self-test categories (e.g., category values), into which the peak values fall, for example, within the self-test signal 178ae of FIG. 4.

Figure 12B:
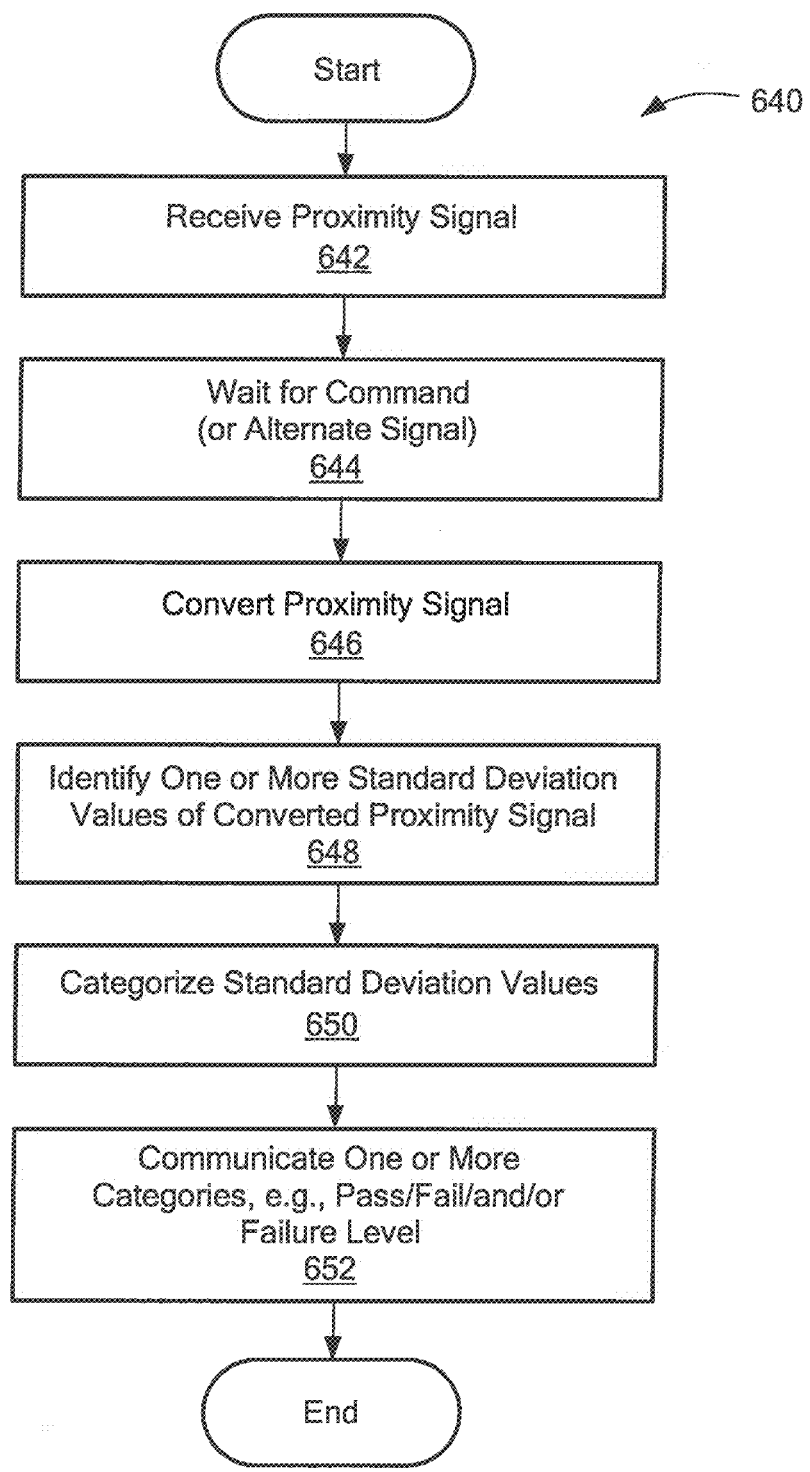
FIG. 12B is a flow chart showing a method of communicating categorized deviation values of a proximity signal generated by a magnetic field sensor.

Referring now to FIG. 12B, a method 640 uses deviation values, and, in particular, standard deviation values.

The method 640 begins at block 642, where the proximity signal, for example, the proximity signal 164a of FIG. 4, is received, for example, by the self-test module 178 of FIG. 4. At block 644, the method 640 waits for either a command portion of the bidirectional signal 176a of FIG. 4, or alternatively, waits for a particular state of one of the alternate control signals, for example, the power on signal 180a of FIG. 4 or the control signal 171a of FIG. 4.

At block 646, upon receiving the command or alternate signal at block 644, the method converts (e.g., converts to digital values) the proximity signal 164a of FIG. 4.

At block 648, the method, i.e., the proper variation detector 353 of FIG. 4, identifies one or more variation values associated with the converted proximity signal. As described above, the variation values can be associated with a variety of characteristics of the proximity signal, including, but not limited to variation of peak-to-peak values, variation of peak values, variation of root mean square (RMS) values, and variation of DC offset values. In some embodiments, the variation values are standard deviation values.

At block 650, the method categorizes the variation values into a plurality of categories, for example, pass, fail, and marginal categories.

At block 652, the method communicates categories e.g., self-test categories (e.g., category values), into which the deviation values fall, for example, within the self-test signal 178af of FIG. 4.

Figure 12C:
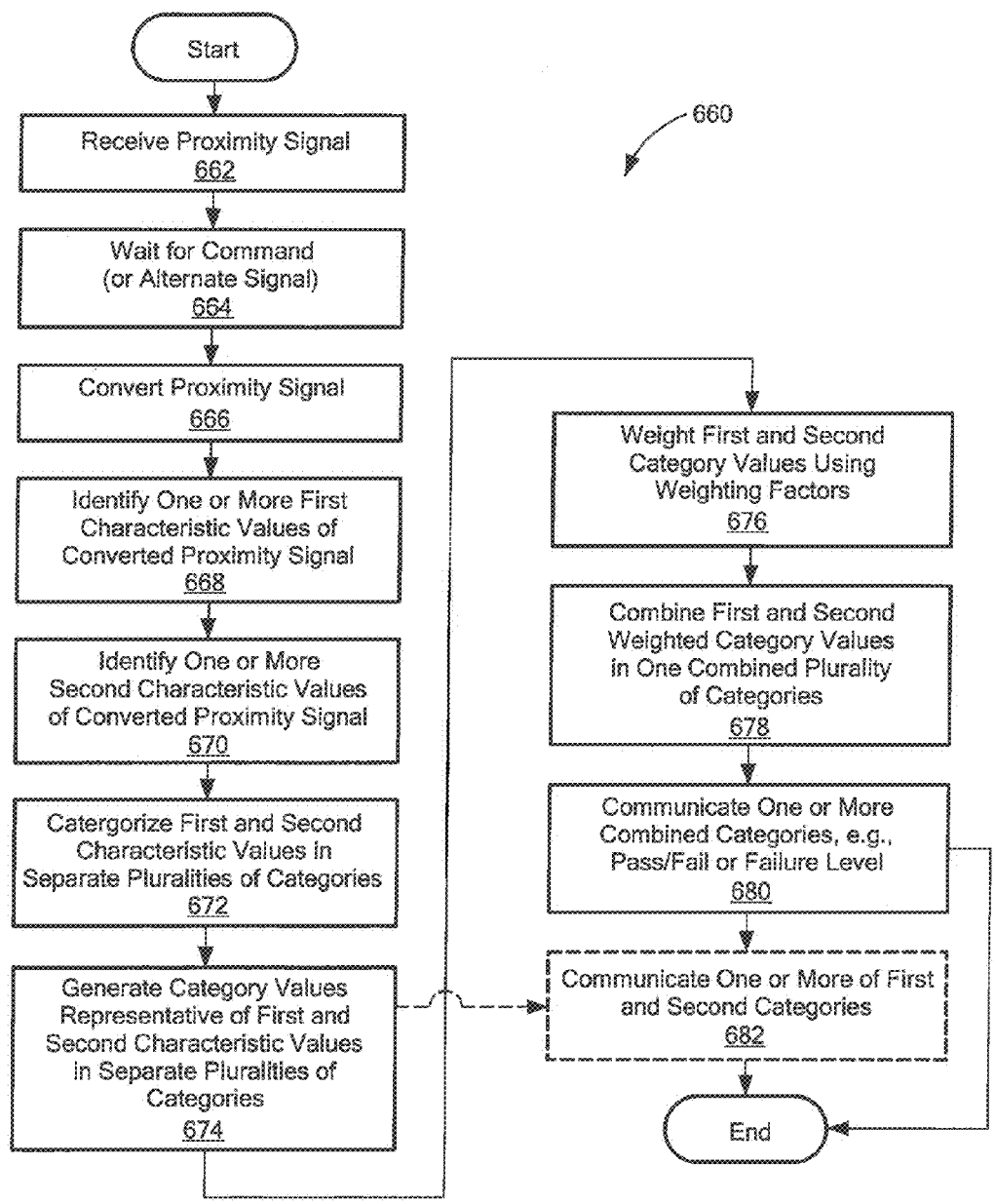
FIG. 12C is a flow chart showing a method of weighting and combining categorized characteristic values of a signal generated by a magnetic field sensor.

Referring now to FIG. 12C, a process 660 is representative of use of DC offset values as in FIG. 11A, in combination with positive and negative peak values as in FIG. 11B.

The method 660 begins at block 662, where the proximity signal, for example, the proximity signal 164a of FIG. 4, is received, for example, by the self-test module 178 of FIG. 4. At block 664, the method 660 waits for either a command portion of the bidirectional signal 176a of FIG. 4, or alternatively, waits for a particular state of one of the alternate control signals, for example, the power on signal 180a of FIG. 4 or the control signal 171a of FIG. 4.

At block 666, upon receiving the command or alternate signal at block 664, the method converts (e.g., converts to digital values) the proximity signal 164a of FIG. 4.

At block 668, the method, i.e., the proper peak/proper DC offset detector 352 of FIG. 4, identifies one or more first characteristic values in the converted proximity signal. In some embodiments, the first characteristic values are DC offset values in accordance with FIG. 11A.

At block 670, the method, i.e., the proper peak/proper DC offset detector 352 of FIG. 4, identifies one or more second characteristic values in the converted proximity signal. In some embodiments, the second characteristic values are peak values in accordance with FIG. 11B.

At block 672, the method categorizes the first and second characteristic values into first and second plurality of categories, for example, pass fail, and marginal categories. The second plurality of categories may or may not be the same categories as the first plurality of categories.

At block 674, the method assigns category values to the first and second characteristic values. Two sets of category values are shown above in conjunction with FIGS. 11A and 11B.

At block 676, the category values can be weighted, for example, in proportion to importance. Using the category values of FIGS. 11A and 11B as examples, the category values shown in FIG. 11A can be assigned a weighting factor of one and the category values shown in FIG. 11B can be assigned a weighting factor of two, indicating that those category values have higher importance.

Thus, the weighted category values become those shown below in Table 1.

TABLE 1

| Signal | Original Category Values | Weighting factor | Weighted Category Values |
|---|---|---|---|
| 550 | 0 | 1 | 0 |
| 554 | 1 | 1 | 1 |
| 558 | 1 | 1 | 1 |
| 562 | 0 | 1 | 0 |
| 550a | 0 | 2 | 0 |
| 554a | 1 | 2 | 2 |
| 558a | 0 | 2 | 0 |
| 562a | 1 | 2 | 2 |

At block 678, the weighted category values can be combined in any one of a variety of ways. In one example shown in Table 2 below, the weighted category values are summed.

TABLE 2

| Signals | First Weighted Category Values | Second Weighted Category Values | Combined Weighted Category Values |
|---|---|---|---|
| 550/550a | 0 | 0 | 0 |
| 554/554a | 1 | 2 | 3 |
| 558/558a | 1 | 0 | 1 |
| 562/562a | 0 | 2 | 2 |

It should be understood that, in a particular sense, the column of combined weighted category values of Table 2 is associated with a combined set of categories. For example, the combined weighted category value of zero is representative of failures of two different signal characteristics at the same time, namely, both the signal DC offset value of the associated signal is out of range and the peak value of the associated signal is out of range.

At block 680, one or more categories (e.g., combined weighted category values) are communicated. As with other category values described above, in some embodiments, combined weighted category values of Table 2 are identified by and communicated by the proper peak/proper DC offset detector 352 of FIG. 4 within the self-test signal 178ae of FIG. 4. In some embodiments, all of the combined weighted category values of Table 2 are communicated. In other embodiments, only a combined weighted category value indicative a predetermined combined category is communicated, for example, a zero, a one, or a two.

In other embodiments, the combined weighted category values are further combined, for example, to generate one or more failures (i.e., zero combined weighted category values) per time value(s), or to generate a total of combined weighted category values per time. Other combinations per time are also possible. In some embodiments, the combined weighted category values, e.g., the zero combined weighted category value per time or the total combined weighted category values per time, are communicated by the above-described proper peak/offset detector 352 of FIG. 4, and upon command, the further combined weighted category values are communicated within the self-test signal 178ae of FIG. 4.

Optionally, at block 682, one or more of the first and second categories (e.g., category values) of Table 1 can be communicated in addition to or in place of the combined weighted category values of Table 2.

Figure 13:
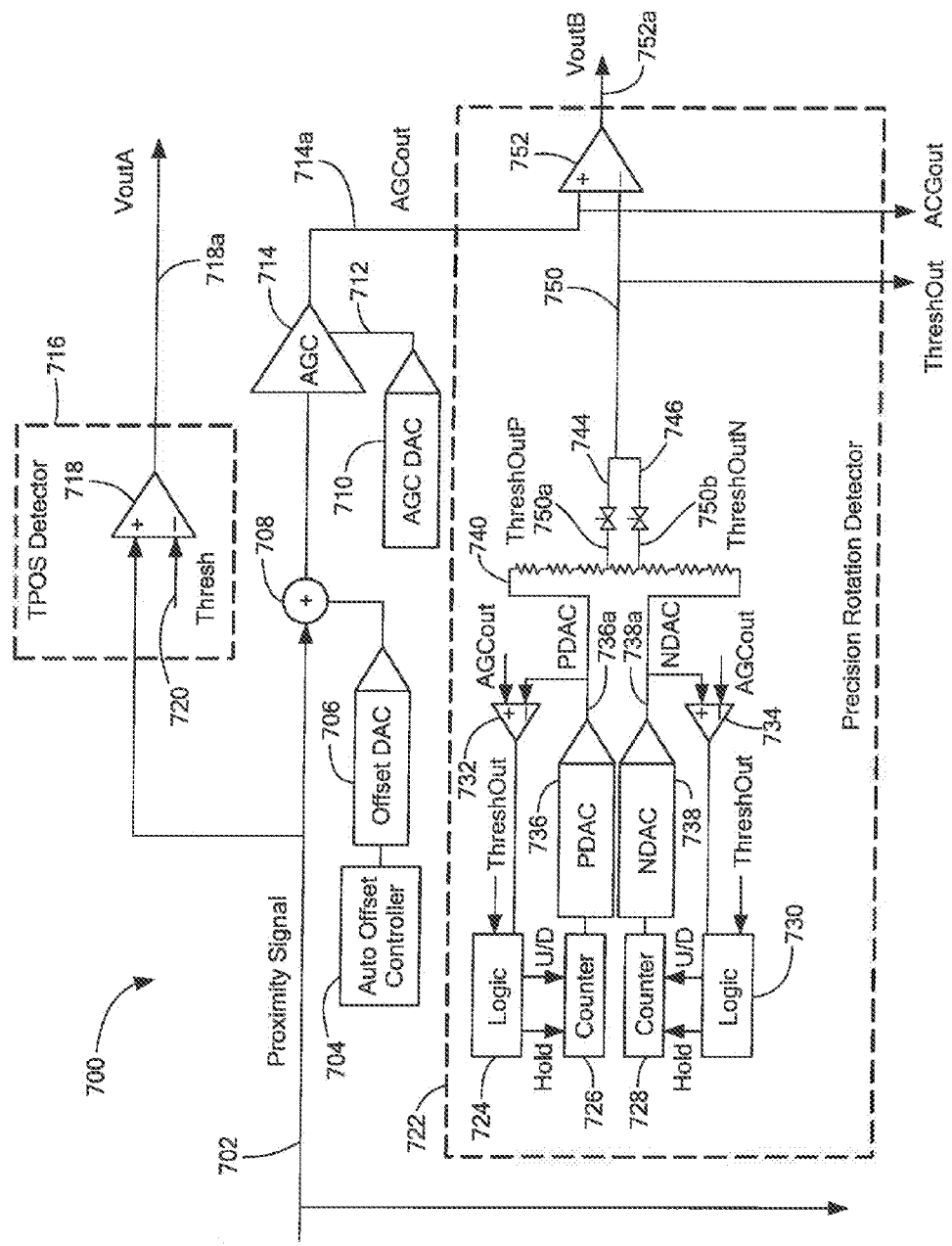
FIG. 13 is a block diagram of an automatic gain control circuit, a TPOS detector, and a precision rotation detector that can be used within a magnetic field sensor.

Referring now to FIG. 13, an electronic circuit 700 includes a precision rotation detector 722, a TPOS detector 716, and an automatic gain control 714. The precision rotation detector 722, the TPOS detector 716, and the automatic gain control 714 can be the same as or similar to the precision rotation detector 170, the TPOS detector 166, and the automatic gain control 168 of FIG. 4. A proximity signal 702 can be the same as or similar to the proximity signal 164a of FIG. 4.

The TPOS detector 718 can be comprised of a comparator 716 coupled to receive the proximity signal 702 at a first input node and coupled to receive a predetermined threshold signal (i.e., voltage) at a second input node. The TPOS detector 718 is configured to generate a TPOS output signal 718a, which can be the same as or similar to the TPOS output signal 166a of FIG. 4.

The automatic gain control 714 is coupled to receive the proximity signal 702. In some embodiments, the proximity signal 702 has a DC offset correction applied by an automatic offset controller 704 and an offset digital-to-analog converter (DAC) 706 via a summing node 708. The AGC 714 is configured to generate a gain controlled signal 714a, which can be the same as or similar to the gain controlled signal 168a of FIG. 4.

The AGC 714 can be controlled by an AGC DAC 710. It should be understood that the proximity signal 702 is representative of the magnetic field experienced by one or more magnetic field sensors, for example, the magnetic field sensors 14a, 14b of FIG. 1.

The gain controlled signal 714a is provided as an input to a comparator 752. The comparator 752 is also coupled to receive a threshold signal 750. Generation of the threshold signal 750 is further described below.

The threshold signal 750 switches between two signals 750a, 750b, a first one 750a of which is a first predetermined percentage (e.g., sixty percent) of a peak-to-peak value of the gain controlled signal 714a and a second one 750b of which is a second predetermined percentage (e.g., forty percent) of the peak-to-peak value of the gain controlled signal 714a. The first and second threshold voltages 750a, 750b are, therefore, centered about a fifty percent point of the gain controlled signal 714a. The comparator 752 generates an output signal 752a having edges closely associated with the times when the gain controlled signal 714a crosses the two thresholds 750a, 750b, which times are near to times when the gain controlled signal 714a is near its fifty percent point. The output signal 752a can be the same as or similar to the high precision rotation detector output signal 170a of FIG. 4.

The threshold voltages 750a, 750b within the threshold signal 750 are generated by counters 726, 728, logic circuits 724, 730, a PDAC 736, an NDAC 738, comparators 732, 734, a resistor ladder 740, and transmission gates 744, 746. The comparator 732 is coupled to receive the gain controlled signal 714a and an output signal 736a generated by the PDAC 736, and, by way of feedback provided by the logic circuit 724 and the counter 726, causes the output of the PDAC 736 (i.e., the PDAC voltage 736a) to track and hold positive peaks of the gain controlled signal 714a. Similarly, the comparator 734 is coupled to receive the gain controlled signal and an output signal 738a generated by the NDAC 738, and, by way of feedback provided by the logic 730 and the counter 728, causes the output of the NDAC 738 (i.e., the NDAC voltage 738a) to track and hold negative peaks of the gain controlled signal 714a. Therefore, the differential voltage between the output 736a of the PDAC 736 and the output 738a of the NDAC 738 is representative of a peak-to-peak amplitude of the gain controlled signal 714a.

Operation of the PDAC and NDAC is further described in U.S. Pat. No. 7,365,530, issued Apr. 29, 2008, which is assigned to the assignee of the present application, and which is incorporated by reference herein in its entirety.

The PDAC and NDAC voltages 736a, 738a, respectively, are provided to opposite ends of a resistor ladder 740. Transmission gates 744, 746 provide the threshold voltage 750 as one of two voltage values as described above, depending upon control voltages (not shown) applied to the transmission gates 744, 746. The control voltages can be related to the output signal 752a.

Figure 14:
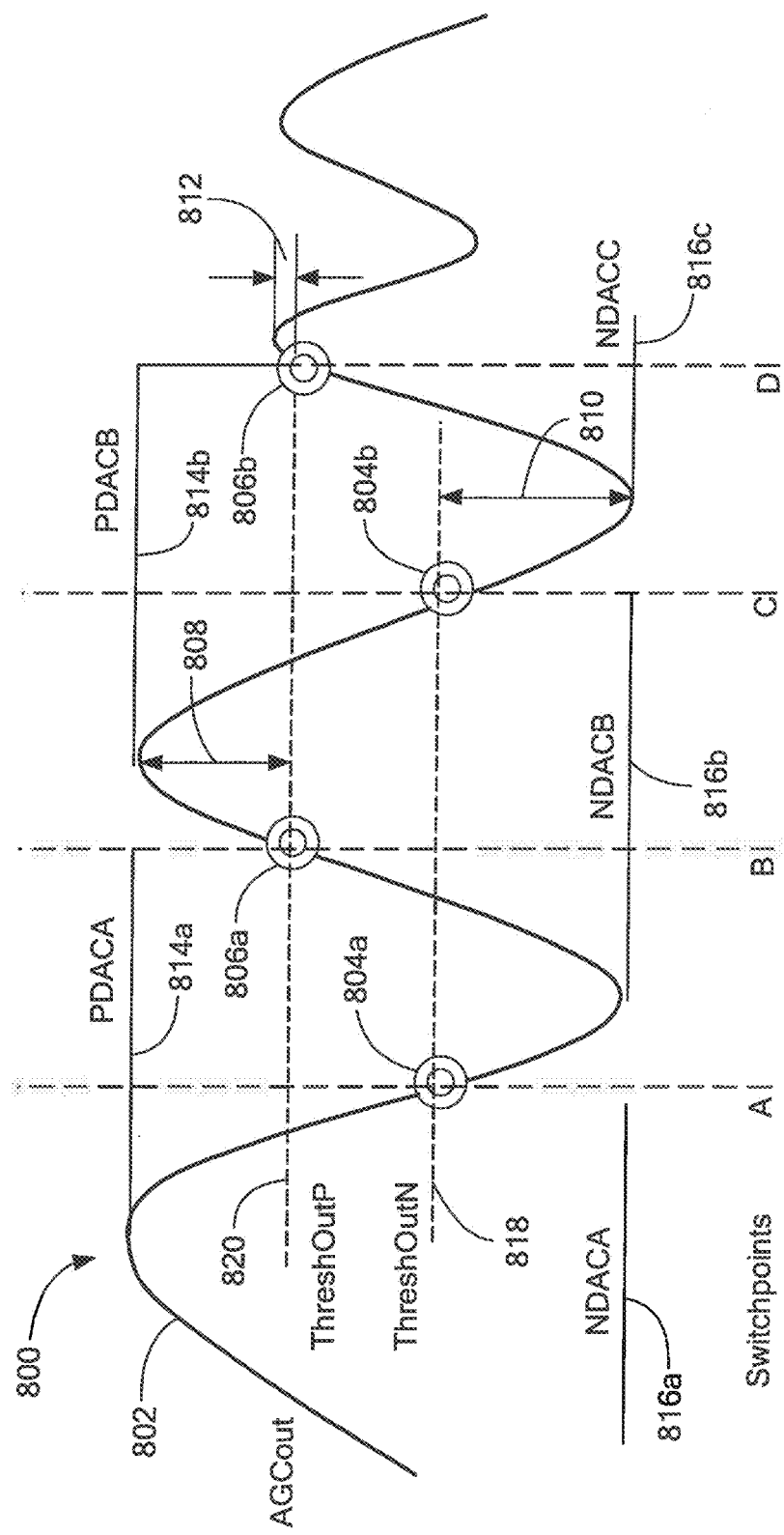
FIG. 14 is a graph showing a gain controlled version of a proximity signal generated by a magnetic field sensor and showing thresholds used by the magnetic field sensor.

Referring now to FIG. 14, a graph 800 has a vertical scale in units of volts in arbitrary units and a horizontal scale in units of time in arbitrary units. A gain controlled signal 802, which can be the same as or similar to the gain controlled (AGC) signal 714a of FIG. 13, is compared against threshold signal values 804a, 804b, 806a, 806b, which can be the same as or similar to threshold signal values 750a, 750b of FIG. 13. Switchpoint times, A, B, C, D represent times of edge transitions of the output signal 752a of FIG. 13.

A PDAC signal 814a, 814b can be the same as or similar to the PDAC signal 736a of FIG. 13 and an NDAC signal 816a, 816b, 816c can be the same as or similar to the NDAC signal 738a of FIG. 13. Lower thresholds 804a, 804b and upper thresholds 806a, 806b are generated as described above, from percentages, e.g., forty percent and sixty percent of the difference between the PDAC signal 814 and the NDAC signal 816.

Each pair of thresholds, for example, the thresholds 806a, 804a, are derived from PDAC and NDAC signals, e.g., 814a, 816a associated with preceding positive and negative peaks of the gain controlled signal 802. Thus, a sudden change of the amplitude of the gain controlled signal 802, as is shown in the last full cycle of the gain controlled signal 802, can result in the gain controlled signal 802 being compared against improper thresholds.

Figure 15:
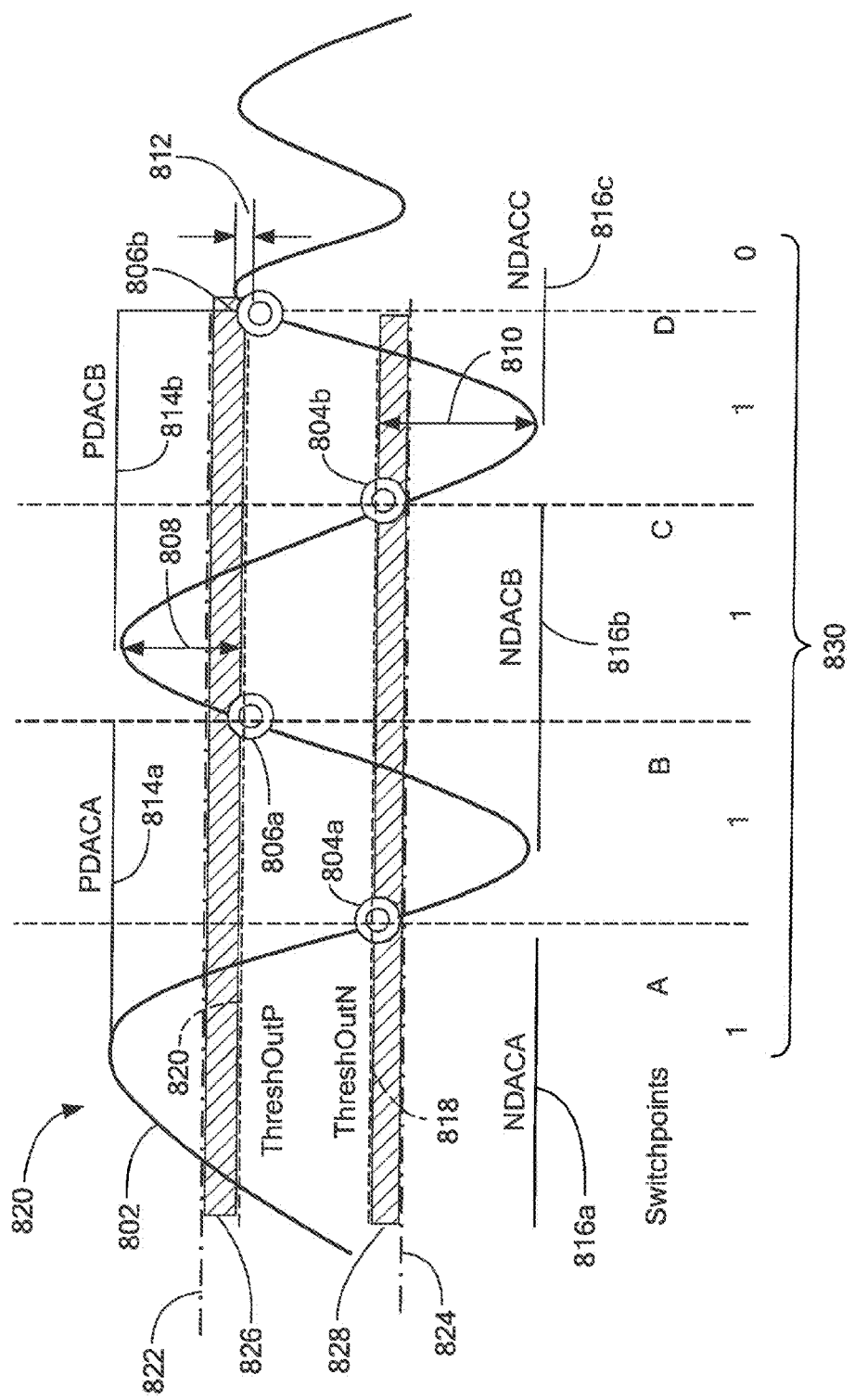
FIG. 15 is a graph showing a gain controlled version of a proximity signal generated by a magnetic field sensor, showing thresholds used by the magnetic field sensor, and showing amplitude ranges that can be used to identify self-test conditions of the magnetic field sensor.

Referring now to FIG. 15, in which like elements of FIG. 14 are shown having like reference designations, a region 826 is representative of a minimum acceptable margin between positive peaks of the gain controlled signal 802 and the upper thresholds 806a, 806b. Similarly, a region 828 is representative of a minimum acceptable margin between negative peaks of the gain controlled signal 802 and the lower thresholds 804a, 804b.

The region 826 can be bounded by the upper threshold values, i.e., by a line 820, and by the upper threshold values plus a margin, e.g., by a line 822. The region 828 can be bounded by the lower threshold values, i.e., by a line 818, and by the lower threshold values minus a margin, e.g., by a line 824. The margins of the upper and lower regions 826, 828 can be the same or different margins.

An arrow 808 is representative of a difference between a positive peak value of the gain controlled signal 802 and a positive threshold value. Similarly, an arrow 810 is representative of a difference between a negative peak value of the gain controlled signal 802 and a negative threshold value of the gain controlled signal 802. The arrows 808, 810 are representative of peak of the gain controlled signal 802 that are sufficient.

A difference 812 between another positive peak of the gain controlled signal 802 and an associated upper threshold is not sufficient. In essence, the difference 812 is smaller than the width of the region 826. Referring briefly to FIG. 13, the positive peak is compared with the threshold 806b by the comparator 752. Noisy and marginal switching of the rotation signal 752a can result.

While the undesirable margin 812 can still result in switching of the output signal, e.g., the output signal 752a of FIG. 13, any further change of the amplitude of the gain controlled signal 802, as may result from temperature changes or wear of a gear assembly being sensed, can result in a missed switching of the output signal.

Category values 830 can be generated upon detection of each peak of the gain controlled signal 802. The category values 830 are representative of passing and failing conditions of differences between the peak values and associated threshold values, i.e., whether cycle peaks of the gain controlled signal 802 fall within the respective regions 826, 828.

The category values 838 can be generated, for example, by the proper threshold detector 354 of FIG. 4 in accordance with difference values 808, 810 and other difference values not explicitly shown.

While only two category values, 0 and 1, are shown, a third category value can be generated when the difference between the peak and the associated threshold has the wrong sign. The wrong sign would occur, for example, if a positive peak were below and associated upper threshold or a negative peak were above an associated lower threshold.

While two regions 826, 828 are shown, in other embodiments, there can be additional similar regions associated with each threshold value, each region representative of a different aspect of passing or failing, i.e., various marginal passing conditions.

Identification of the upper and the lower amplitude regions 826, 828 can be determined, for example, by the proper threshold detector 354 of FIG. 4. The marginal or failing conditions can also be determined by the proper threshold detector 354 of FIG. 4. The failing or marginal condition can be communicated by the self-test signal 178aa of FIG. 4.

Figure 16:
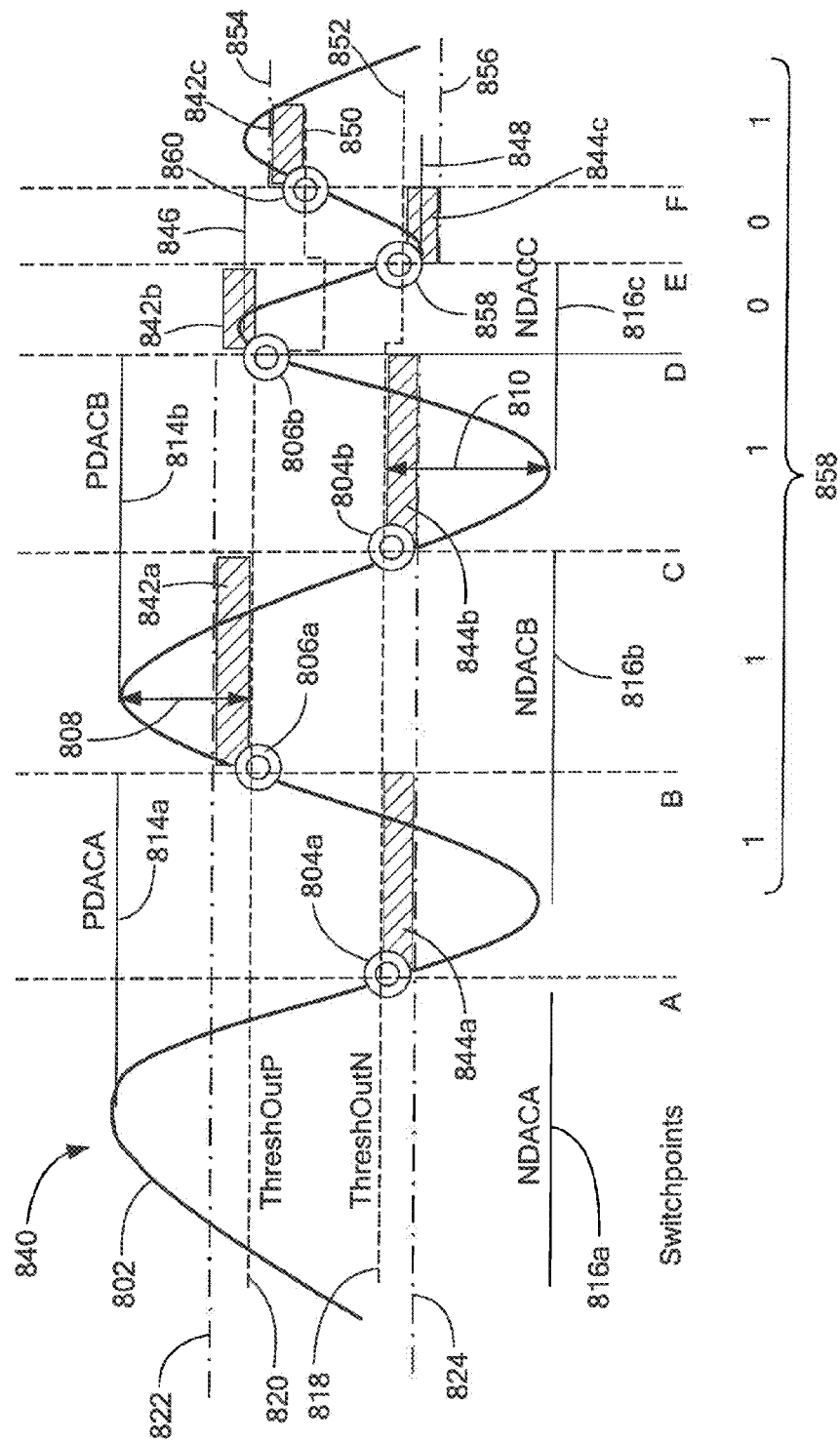
FIG. 16 is a graph showing a gain controlled version of a proximity signal generated by a magnetic field sensor, showing thresholds used by the magnetic field sensor, and showing other amplitude ranges that can be used to identify self-test conditions of the magnetic field sensor.

Referring now to FIG. 16, in which like elements of FIGS. 14 and 15 are shown having like reference designations, the gain controlled signal 802 is shown, along with upper thresholds 806a, 806b860 and lower thresholds 804a, 804b, 858.

PDAC values 814a, 814b, 846 correspond to the PDAC signal 736a of FIG. 13. NDAC values 816a, 816b, 816c, 848 correspond to the NDAC signal 738a of FIG. 13.

A plurality of upper regions 842a, 842b, 842c and a plurality of lower regions 844a, 844b, 844c are shown. The upper regions 842a, 842b, 842c have widths corresponding to a respective upper threshold value (e.g., 820, 850) plus a margin value. The lower regions 844a, 844b, 844c have widths corresponding to a respective lower threshold value (e.g., 824, 852) minus a margin value. The margin values can be the same or different. The margin values can also be constant regardless of the threshold values, or they can have values proportional to associated threshold values.

Unlike the upper and lower regions 826, 828, respectively, of FIG. 15, which have substantially constant positions, the upper and lower regions 842a, 842b, 842c 844a, 844b, 844c of FIG. 16 can move with each one of the threshold values, each bounded on one side by a respective threshold value, which can move cycle to cycle. Function of the upper and lower regions 842a, 842b, 842c, 844a, 844b, 844c will be understood from the discussion above in conjunction with FIG. 15.

Category values 858 can be generated upon detection of each peak of the gain controlled signal 802. The category values 858 are representative of passing and failing conditions of differences between the peak values and associated threshold values, i.e., whether cycle peaks of the gain controlled signal 802 fall within the respective regions 842a, 842b, 842c, 844a, 844b, 844c.

The category values 858 can be generated, for example, by the proper threshold detector 354 of FIG. 4 in accordance with difference values 808, 810 and other difference values not explicitly shown.

While regions 842a, 842b, 842c, 844a, 844b, 844c are shown, in other embodiments, there can be additional similar regions associated with each threshold value, each region representative of a different aspect of passing or failing, i.e., various marginal passing conditions.

Figure 17:
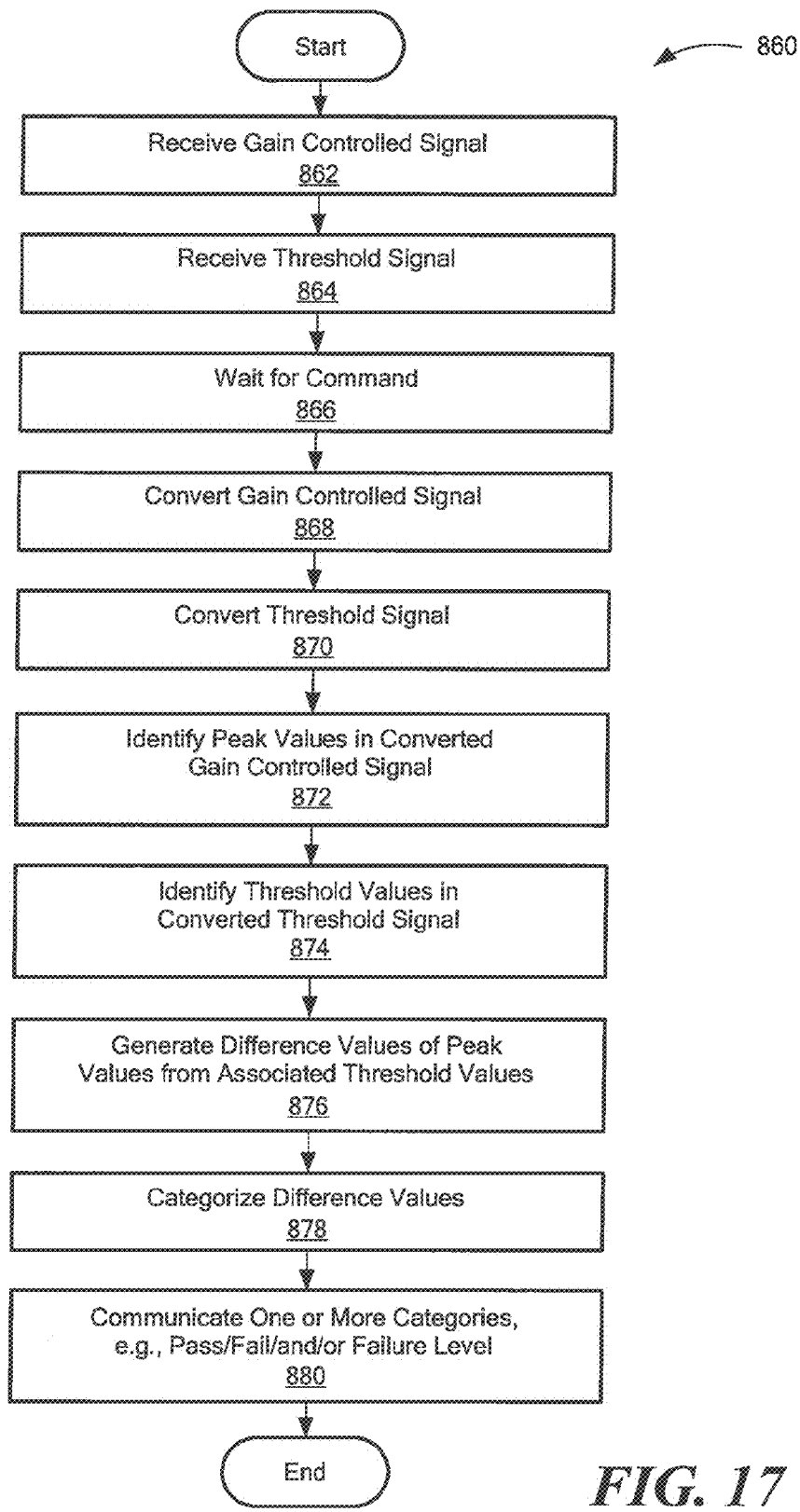
FIG. 17 is a flow chart showing a method of communicating results of yet another self-test associated with a magnetic field sensor.

Referring now to FIG. 17, a method 860 is associated with the self-test signal 178aa of FIG. 4 and associated with the functions described above in conjunction with FIGS. 14-16.

The method 860 begins at block 862, where a gain controlled signal, for example, the gain controlled signal 168a of FIG. 4, is received, for example, by the self-test module 178 of FIG. 4, and, in particular, by the ADC 349 of FIG. 4. At block 864, a threshold signal, for example, the threshold signal 170b of FIG. 4, is received, for example, by the self-test module 178 of FIG. 4, and, in particular, by the ADC 348 of FIG. 4.

At block 866, the method 860 waits for either a command portion of the bidirectional signal 176a of FIG. 4, or alternatively, waits for a particular state of one of the alternate control signals, for example, the power on signal 180a of FIG. 4 or the control signal 171a of FIG. 4.

At block 868, upon receiving the command or particular state of the alternate signal at block 866, the method converts the gain controlled signal 168a of FIG. 4, for example, with the ADC 349 of FIG. 4.

At block 870, upon receiving the command or particular state of the alternate signal at block 866, the method converts the threshold signal 170b of FIG. 4, for example, with the ADC 348 of FIG. 4.

At block 872, the self-test module 178, and, in particular, the proper threshold detector 354 of FIG. 4, identifies positive and negative peak values in the converted gain controlled signal.

At block 874, the proper threshold detector 354 of FIG. 4 identifies threshold values in the converted threshold signal. The identified threshold values can be the same as or similar to the threshold values 804a, 804b, 804c, 806a, 806b, 806c of FIG. 14.

At block 876, the proper threshold detector 354 of FIG. 4 generates difference values by identifying differences between the peak values and associated threshold values. A difference value 808 is shown in FIG. 16.

At block 878, the difference values are categorized. For example, in some embodiments, ranges 842a, 842b, 842c, 844a, 844cb, 844c described above in conjunction with FIG. 16, can be used to identify passing, failing, and marginal conditions of the difference signals.

At block 880, the identified categories (e.g., category values) are communicated, for example, within the self-test signal 178aa of FIG. 4.

While gain controlled signals are described above, as described above, in other embodiments, the gain controlled signal (generated by an AGC0 can be replaced by a fixed gain signal (generated by a fixed gain amplifier or a buffer).

While certain characteristic values (e.g., peak values) are shown in examples above, it should be recognized that other characteristic values can be used that are characteristic values of, related to, or associated with the proximity signal.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A method of performing a self-test associated with a magnetic field sensor, comprising:
    generating a proximity signal responsive to a proximity of a sensed object;
    generating a threshold signal proportional to peak values of the proximity signal;
    identifying a plurality of peak values representative of peaks of the proximity signal;
    identifying a plurality of threshold values of the threshold signal;
    generating one or more difference values by differencing the identified peak values and associated identified threshold values;
    categorizing the one or more difference values into a plurality of potential categories, wherein the plurality of potential categories is representative of a plurality of self-test states of the proximity signal, wherein at least one of the plurality of potential categories is representative of a respective passing self-test and wherein another at least one of the plurality of potential categories is representative of a respective marginally passing self-test;
    assigning a respective plurality of category values to the plurality of potential categories; and
    communicating at least one of the plurality of category values indicative of at least one of the plurality of potential categories into which at least one of the one or more difference values was categorized.

2. The method of claim 1, further comprising;
    receiving a command signal from outside the magnetic field sensor to begin the communicating.

3. The method of claim 1, further comprising:
    receiving a command signal from outside of the magnetic field sensor to begin the identifying the plurality of threshold values, the generating the one or more difference values, the categorizing the one or more difference values, and the communicating.

4. The method of claim 1, further comprising;
    identifying a minimum acceptable margin above or below the at least one of the plurality of threshold values; and
    identifying a window between the at least one of the plurality of threshold values and the minimum acceptable margin above or below the at least one of the plurality of threshold values; wherein the at least one of the potential categories representative of the respective marginally passing self-test is indicative of one of the plurality of peak values being within the window.

5. The method of claim 1, wherein the proximity signal is responsive to a magnetic field influenced by the sensed object.

6. A magnetic field sensor, comprising:
    a substrate;
    one or more magnetic field sensing elements disposed on the substrate and configured to generate a proximity signal responsive to a proximity of a sensed object;
    an amplifier circuit disposed on the substrate and configured to generate an amplified signal representative of the proximity signal;
    a processing module disposed on the substrate and configured to generate a threshold signal proportional to peak values of the amplified signal;
    a self-test module disposed on the substrate, wherein the self-test module is configured to identify a plurality of peak values representative of peaks of the amplified signal, configured to identifying a plurality of threshold values of the threshold signal, configured to generate one or more difference values by differencing the identified peak values and associated identified threshold values, configured to categorize the one or more difference values into a plurality of potential categories, wherein the plurality of potential categories is representative of a plurality of self-test states of the proximity signal, wherein at least one of the plurality of potential categories is representative of a respective passing self-test and wherein another at least one of the plurality of potential categories is representative of a respective marginally passing self-test, and configured to assign a respective plurality of category values to the plurality of potential categories; and
    an output format module disposed on the substrate and configured to communicate at least one of the plurality of category values indicative of at least one of the plurality of potential categories into which at least one of the one or more difference values was categorized.

7. The magnetic field sensor of claim 6, wherein the output format module is further configured to receive a command signal from outside the magnetic field sensor to begin the communicating.

8. The magnetic field sensor of claim 6, wherein the output format module is further configured to receive a command signal from outside of the magnetic field sensor to begin the identifying the plurality of threshold values, the generating the one or more difference values, the categorizing the one or more difference values, and the communicating.

9. The magnetic field sensor of claim 6 wherein the self-test module is further configured to identify a minimum acceptable margin above or below the at least one of the plurality of threshold values, and to identify a window between the at least one of the plurality of threshold values and the minimum acceptable margin above or below the at least one of the plurality of threshold values; wherein the at least one of the potential categories representative of the respective marginally passing self-test is indicative of one of the plurality of peak values being within the window.

10. The magnetic field sensor of claim 6, wherein the proximity signal is responsive to a magnetic field influenced by the sensed object.

* * * * *